(12) United States Patent
Fimoff et al.

(10) Patent No.: US 6,563,436 B2
(45) Date of Patent: May 13, 2003

(54) KERDOCK CODING AND DECODING SYSTEM FOR MAP DATA

(75) Inventors: Mark Fimoff, Hoffman Estates, IL (US); Richard W. Citta, Oak Park, IL (US); Jingsong Xia, Mundelein, IL (US)

(73) Assignee: Zenith Electronics Corporation, Lincolnshire, IL (US)

( * ) Notice: Subject to any disclaimer, the term of this patent is extended or adjusted under 35 U.S.C. 154(b) by 0 days.

(21) Appl. No.: 10/011,333

(22) Filed: Dec. 3, 2001

(65) Prior Publication Data

US 2003/0058140 A1 Mar. 27, 2003

Related U.S. Application Data

(60) Provisional application No. 60/324,096, filed on Sep. 24, 2001.

(51) Int. Cl.$^7$ .................................................. H03M 7/00
(52) U.S. Cl. ........................................... 341/50; 341/51
(58) Field of Search .............................. 341/50, 51, 67

(56) References Cited

U.S. PATENT DOCUMENTS

| 4,517,552 | A | * | 5/1985 | Shirota et al. ............ 340/347 |
| 5,452,009 | A | | 9/1995 | Citta |
| 5,572,532 | A | | 11/1996 | Fimoff et al. |
| 5,938,787 | A | * | 8/1999 | Stark ........................... 714/755 |
| 6,219,358 | B1 | | 4/2001 | Pinder et al. |
| 6,226,318 | B1 | | 5/2001 | Citta et al. |

FOREIGN PATENT DOCUMENTS

WO     WO 95/18494     7/1995

OTHER PUBLICATIONS

International Search Report.
Alan W. Nordstrom, "An Optimum Nonlinear Code", Information and Control 11, (1968), pp. 613–616; & 618, 619.

* cited by examiner

Primary Examiner—Peguy JeanPierre
Assistant Examiner—Joseph Lauture

(57) ABSTRACT

A code vector comprising 2N data elements is generated in response to N input data elements. The first N data elements of the code vector represent a replica of the N input data elements, and the second N data elements of the code vector comprise N parity data elements. The combination of the first N data elements and the second N data elements forms a Kerdock code vector. The Kerdock code vector is decoded to recover the N input data elements by selecting one of a possible $2^N$ Kerdock code vectors as a best estimate of the Kerdock code vector. The selected Kerdock vector comprises 2N data elements, and only the first N data elements of the selected Kerdock code vector are used as the N input data elements.

78 Claims, 6 Drawing Sheets

US 6,563,436 B2

KERDOCK CODING AND DECODING SYSTEM FOR MAP DATA

RELATED APPLICATIONS

This application claims the benefit of U.S. Provisional Application No. 60/324,096 filed on Sep. 24, 2001.

TECHNICAL FIELD OF THE INVENTION

The present invention relates to the coding and decoding of data, such as map data that indicate the distribution of first and second data segments in a transmitted data field.

BACKGROUND OF THE INVENTION

The ATSC digital television standard presently provides for the transmission of successive data fields each comprising 313 segments extending over a 24.2 ms time interval. FIG. 1 discloses an exemplary format for a data field according to this standard. The first segment of each field is a field sync segment. The field sync segment is composed of four two-level segment sync symbols and space for 828 other two-level symbols. A portion of this space is used for a field sync, and another portion of this field is reserved. Each of the remaining segments of each field comprises four two-level segment sync symbols and 828 n-level data symbols where n is currently eight, although n could be other integers such as two, four, sixteen, etc.

As indicated by U.S. patent application Ser. No. 09/804,262 filed on Mar. 13, 2001, there is presently some interest in extending the ATSC digital television standard to allow a field to contain a mix of more robustly coded data (referred to herein as E-VSB data) and the data currently provided for in the standard (referred to herein as VSB data). Preferably, the data mix is employed on a segment-by-segment basis such that some segments of a field are used to transmit VSB data exclusively and the remaining segments of the field are used to transmit E-VSB segments exclusively. However, it is possible that all data segments of a field could contain either E-VSB data segments exclusively or VSB data segments exclusively. Moreover, it is also possible that the E-VSB data contained in some segments of a field may be coded with one robust coding rate and that the E-VSB data in other segments of the field may be coded at other robust coding rates.

As disclosed in the above mentioned '262 application, a map that indicates which segments contain the more robust (E-VSB) data and which segments contain standard VSB data is preferably provided by the transmitter to the receiver so that the receiver can properly decode and otherwise process the received VSB and E-VSB data. Assuming that a field contains E-VSB data at different coding rates, the map in that case must also designate the coding rates that apply to the differently coded E-VSB data segments.

The '262 application describes one mapping system. Co-pending U.S. patent application Ser. No. (7024) filed on describes another mapping system that reliably identifies which segments contain first data (such as VSB data) and which segments contain second data (such as E-VSB data). The present invention is directed to the coding and decoding of data, such as the map data that identifies which segments contain the first data and which segments contain the second data.

SUMMARY OF THE INVENTION

In accordance with one aspect of the present invention, a method of generating a code vector comprises the following: providing N input data elements; and, generating a code vector comprising 2N data elements in response to the N input data elements, the first N data elements of the code vector representing a replica of the N input data elements, and the second N data elements of the code vector comprising N parity data elements. The combination of the first N data elements and the second N data elements form a Kerdock code vector.

In accordance with another aspect of the present invention, a method is provided to decode a received Kerdock code vector in order to produce an output data signal. The received Kerdock code vector comprises 2N data elements. The method comprises the following: selecting one of a possible $2^N$ Kerdock code vectors as a best estimate of the received Kerdock code vector, wherein the selected Kerdock vector comprises 2N data elements; and, using only the first N data elements of the selected Kerdock code vector as the output data signal.

In accordance with yet another aspect of the present invention, a method of decoding a systematic code vector to produce a decoded data signal comprises the following: receiving the systematic code vector; re-arranging the data elements in the received systematic code vector to form a non-systematic code vector; and, decoding the non-systematic code vector using a non-systematic decoder to produce the decoded data signal.

In accordance with still another aspect of the present invention, a method of decoding a code vector comprises the following: receiving an N element map data unit encoded in the form of a 2N element systematic Kerdock code vector, wherein the map data unit represents a distribution of first and second data segments in a received field; decoding the 2N element systematic Kerdock code vector by selecting one of a possible $2^N$ Kerdock code vectors as a best estimate of the 2N element systematic Kerdock code vector, wherein the selected Kerdock code vector comprises 2N elements; and, using the first N elements of the selected Kerdock code vector as the N element map data unit.

BRIEF DESCRIPTION OF THE DRAWINGS

These and other features and advantages of the present invention will become more apparent from a detailed consideration of the invention when taken in conjunction with the drawings in which.

DETAILED DESCRIPTION

In order to indicate which segments of a field contain VSB data and which segments of a field contain E-VSB data, a twelve bit map data unit (mdu) is defined for each data field. Accordingly, the map data unit is capable of designating one of 4096 possible combinations of VSB and E-VSB data segments for a respective field. The map data unit for an odd ATSC transmitted field may be denoted as $\{A_0 \, B_0 \, C_0\}$, and the map data unit for the next succeeding even ATSC transmitted field may be denoted as $\{A_e \, B_e \, C_e\}$, where $A_0$, $B_0$, $C_0$, $A_e$, $B_e$, and $C_e$ each comprises four bits and is referred to herein as a map data sub-unit. Thus, each map data unit comprises twelve bits and two map data units for successive odd and even fields comprise twenty-four bits.

Figures 1, 2:
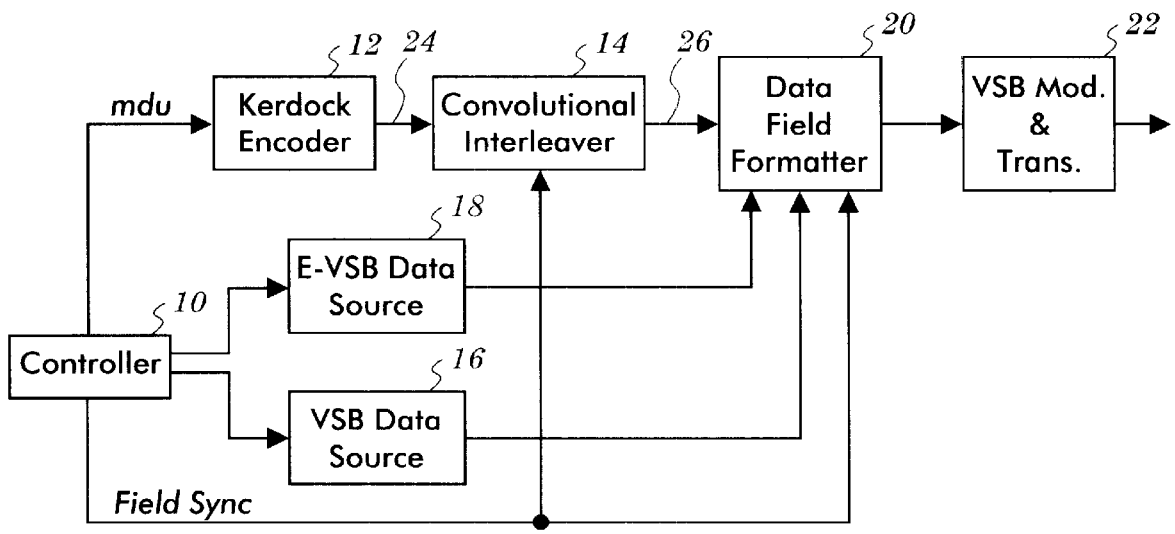
FIG. 1 is a diagram illustrating an exemplary format of a field as defined in the ATSC digital television standard.
FIG. 2 is a schematic diagram of a map insertion system that inserts a map into fields to be transmitted.

As shown in FIG. 2, a controller 10 generates a sequence of map data units for application to a Kerdock encoder 12. Kerdock encoders that may be used for the Kerdock encoder 12 are disclosed below. Eight bits at a time are supplied to the Kerdock encoder 12. Thus, the first eight bits supplied to the Kerdock encoder 12 correspond to map data sub-units $A_0$ $B_0$, the next eight bits supplied to the Kerdock encoder 12 correspond to map data sub-units $C_0 \, A_e$, and the next eight bits supplied to the Kerdock encoder 12 correspond to map data sub-units $B_e \, C_e$. The map data units for succeeding fields are applied to the Kerdock encoder 12 in a like fashion.

For each eight bit input, the Kerdock encoder 12 produces a sixteen bit code word or vector that consists of the eight input bits and eight parity bits $P_x$. Accordingly, for input map data sub-units $A_0 \, B_0$, the output of the Kerdock encoder 12 is a code word or vector $\{A_0 \, B_0 \, P_1\}$; for map data sub-units $C_0 \, A_e$, the output of the Kerdock encoder 12 is $\{C_0 \, A_e \, P_2\}$; and, for map data sub-units $B_e \, C_e$, the output of the Kerdock encoder 12 is $\{B_e \, C_e P_3\}$. Thus, three map data sub-units covering successive odd and even fields n and n+1 are thereby encoded into three sixteen bit output vectors containing forty-eight bits in all.

The code vectors that are produced by the Kerdock encoder 12 are processed by a convolutional interleaver 14 in order to provide protection from burst noise. Convolutional interleavers and de-interleavers are described in the ATSC digital television standard. An interleaver that may be used for the convolutional interleaver 14 is disclosed in U.S. Pat. No. 5,572,532. The convolutional interleaver 14 is preferably characterized by the parameters N=48, B=16 and M=3, where N is M times the block size (16 data elements) corresponding to three encoded map vectors produced by the Kerdock encoder 12, B is the interleave depth, and M is the delay unit size of the interleaver. Thus, the convolutional interleaver 14 delays the individual bits of the forty-eight bits of each block of three code vectors by 0, 3, 6, . . . , 45 bits at the output of the convolutional interleaver 14.

The convolutional interleaver 14 is preferably synchronized to the ATSC field sync signal that is generated by the controller 10 so that the successive delays on the input bits are reset at the end of each field. Accordingly, each field begins with zero delay. As will be explained in further detail hereinafter, each set of forty-eight interleaved bits of the blocks of three code vectors are duplicated for transmission as two level symbols in the reserved portion of two consecutive field sync segments. It will be appreciated that this Kerdock coding and duplication results in an effective coding rate of ¼ because the map bits are doubled in number by the Kerdock encoder 12 and are doubled in number again by the duplication, so that twenty-four bits representing two map data units are coded into ninety-six bits in two field sync segments.

It will also be appreciated that, considering the corresponding de-interleaver in the receiver, a latency interval L must be accounted for when associating the map data units with the corresponding fields. The latency interval of the interleaver/de-interleaver combination is given by the expression L=N×(B−1). In the specific example of the convolutional interleaver 14 given above, N=48 and B=16. Therefore, the latency interval of the interleaver/de-interleaver combination according to this example is L=48× 15=720 bits or 15 (720/48) fields. If two additional fields are allowed for processing time, the system may be characterized by the following relationships:

Coded mdu for field $n$: $A_0 B_0 P_1 C_0 A_E P_2 B_E C_E P_3$

Coded mdu for field $n+1$: $A_0 B_0 P_1 C_0 A_E P_2 B_E C_E P3$ where mdu $A_0 B_0 C_0$ identifies the mix of VSB and E-VSB segments for field n+2+L and where mdu $A_E B_E C_E$ identifies the mix of VSB and E-VSB segments for field n+3+L.

A VSB data source 16 provides VSB data and an E-VSB data source 18 provides E-VSB data. One result of the Kerdock encoding applied by the Kerdock encoder 12 is that the mdus are more robustly encoded than are the VSB data and the E-VSB data. The controller 10 controls the VSB data source 16 and the E-VSB data source 18 so as to control the mix of VSB and E-VSB data segments in a particular field. Because of the system latency interval, the map data unit, which notifies the receiver of this mix and which is encoded by the Kerdock encoder 12, is transmitted beginning in a field that is transmitted 17 or 18 fields earlier than the field containing that mix and ends in a field that is transmitted 1 or 2 fields earlier that the field containing that mix. That is, the map data unit supplied by the controller 10 to the Kerdock encoder 12 during formatting of the current field corresponds to VSB and/or E-VSB data to be transmitted 17 or 18 fields later. However, because of the interleaving performed by the convolutional interleaver 38, this map data unit is spread over 15 fields.

The data segments supplied by the VSB data source 16 and the E-VSB data source 18, together with the encoded and interleaved map data unit bits from the convolutional interleaver 14, are applied to a data field formatter 20. The data field formatter 20 is synchronized to the field sync signal from the controller 10 and formats the transmitted field so that the forty-eight encoded and interleaved map data unit bits are inserted into the reserved portion of two successive field sync segments. The VSB data source 16 and the E-VSB data source 18 are controlled by the controller 10 so that the VSB and E-VSB data segments supplied by the VSB data source 16 and the E-VSB data source 18 to the data field formatter 20 correspond to a map data unit transmitted beginning n+2+L or n+3+L fields prior thereto. The data field formatter 20 is synchronized so that these VSB and E-VSB data segments are appropriately multiplexed throughout the current field in accordance with that previously transmitted map data unit.

Finally, the formatted fields are successively applied to a standard ATSC modulator and transmitter 22 for transmission.

Figure 3:
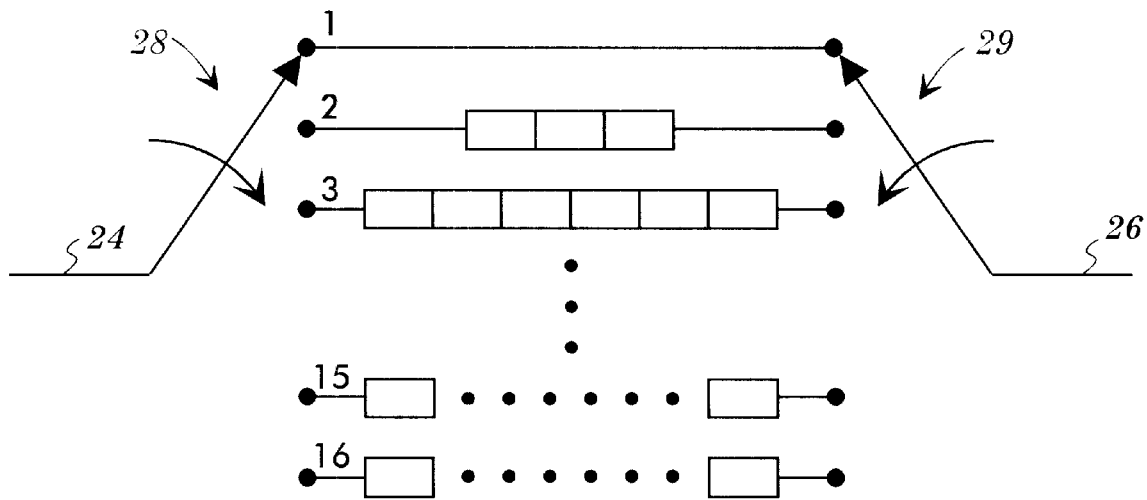
FIG. 3 shows an example of a convolutional interleaver that can be used in the map insertion system shown in FIG. 2.

An example of the convolutional interleaver 14 is shown in FIG. 3 and includes sixteen paths coupled between an input 24 and an output 26 by corresponding synchronized switching functions 28 and 29. As shown in FIG. 2, the input 24 is coupled to the Kerdock encoder 12 and the output 26 is coupled to the data field formatter 20. The switching functions 28 and 29 synchronously step through the sixteen paths on a data element-by-data element basis so that one data element received on the input 24 is coupled through the first path to the output 26, so that the next data element received on the input 24 is coupled through the second path to the output 26, and so on.

The first path of the convolutional interleaver 14 imposes no delay on the data elements passing therethrough, the second path of the convolutional interleaver 14 imposes a three element delay on the data elements passing therethrough, the third path of the convolutional interleaver 14 imposes a six element delay on the data elements passing therethrough, . . . , and the sixteenth path of the convolutional interleaver 14 imposes a forty-five element delay on the data elements passing therethrough.

Figure 4:
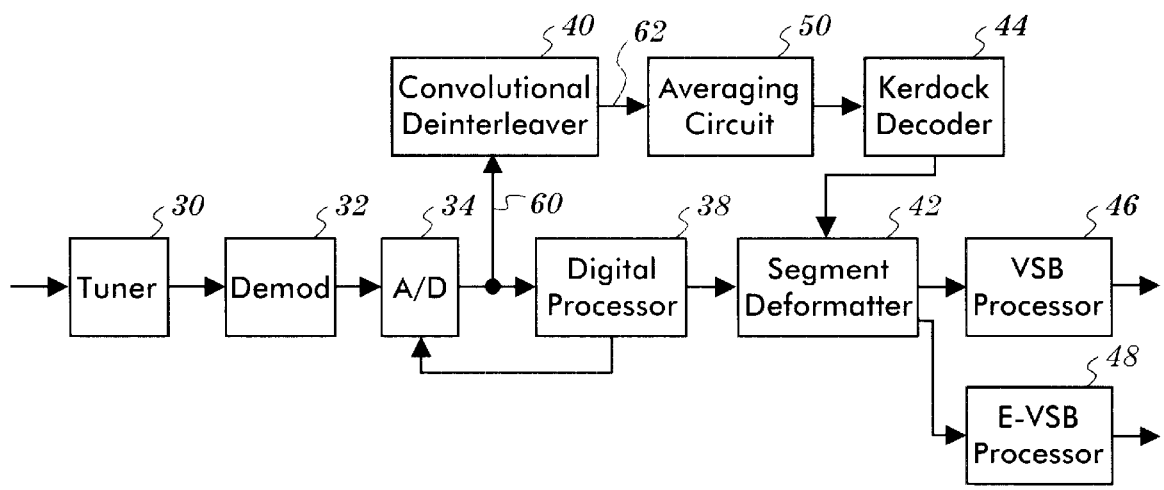
FIG. 4 is a schematic diagram of a portion of a receiver involved in de-formatting a received field based upon a received map.

As shown in FIG. 4, the signal transmitted by the ATSC modulator and transmitter 22 is received by a receiver comprising a tuner 30. The IF output of the tuner 30 is demodulated by an ATSC demodulator 32 in order to provide an analog baseband output representing the transmitted symbols. This analog signal is sampled by an A/D converter 34 under control of a digital processor 38 to convert the demodulated symbols into corresponding multi-bit digital values. The encoded and interleaved map data unit symbols, which are duplicated in successive fields as discussed above, are applied to a convolutional de-interleaver 40. The remaining symbols are directly applied to the digital processor 38, which converts these remaining symbols to corresponding bits, arranged in data bytes, for application to a segment de-formatter 42. The segment de-formatter 42 receives a de-interleaved and decoded map data unit from a Kerdock decoder 44. The segment de-formatter 42 responds to this de-interleaved and decoded map data unit by passing the VSB segments in the field to a VSB processor 46 and by passing the E-VSB segments in the field to an E-VSB processor 48. The VSB processor 46 and the E-VSB processor 48 decode and otherwise process the respective VSB data and E-VSB data from the segment de-formatter 42.

As an example, the VSB processor 46 may perform Reed-Solomon decoding and, in the case where the VSB data has been trellis encoded in the transmitter, the VSB processor 46 may also perform Viterbi decoding. The E-VSB processor 48, for example, may perform the same decoding as the VSB processor 46 and, in addition, perform the additional decoding corresponding to the additional coding that was performed in the transmitter in order to add robustness to the data. Moreover, the VSB processor 46 and the E-VSB processor 48 may perform de-interleaving and de-randomization.

The interleaved map data unit symbols from the A/D converter 34 are applied to the convolutional de-interleaver 40 which de-interleaves the map data unit symbols in inverse fashion relative to the convolutional interleaver 14 in order to provide the vectors produced by the Kerdock encoder 12. The de-interleaved vectors corresponding to a map data unit and to its corresponding duplicate map data unit are averaged on a bit-by-bit basis by an averaging circuit 50 in order to improve the reliability of the map data units. The de-interleaved and averaged vectors are decoded by the Kerdock decoder 44 in order to recover the map data units that control the segment de-formatter 42. Since the mdus were encoded more robustly than either the VSB data or the E-VSB data, the mdus will be recovered in the receiver with less errors than the data.

As explained previously, the latency interval of the interleave/de-interleave process is accommodated in the system because the map data units provided by the controller 10 define the mix of VSB and E-VSB data segments that are to be transmitted L fields later in time. Exemplary embodiments of the Kerdock decoder 44 and the convolutional de-interleaver 40 are disclosed in the previously referenced U.S. Pat. Nos. 6,226,318 B1 and 5,572,532 respectively.

As discussed below in more detail, the Kerdock decoder 44 may be arranged to provide an estimation of the reliability of the decoding process. In terms of the map data unit specifically, the Kerdock decoder 44 may be arranged to provide an estimation of the reliability of the decoding of the map data unit. If this reliability indicates that the decoded map data unit is not reliable, the immediately previous map data unit that was reliably decoded is used to de-format the field instead of the currently decoded map data unit. This operation is justified by assuming that the mix between VSB data and E-VSB data changes from field to field at a relatively slow rate so that the substitute map data unit will likely define the appropriate segment mix.

Figure 5:
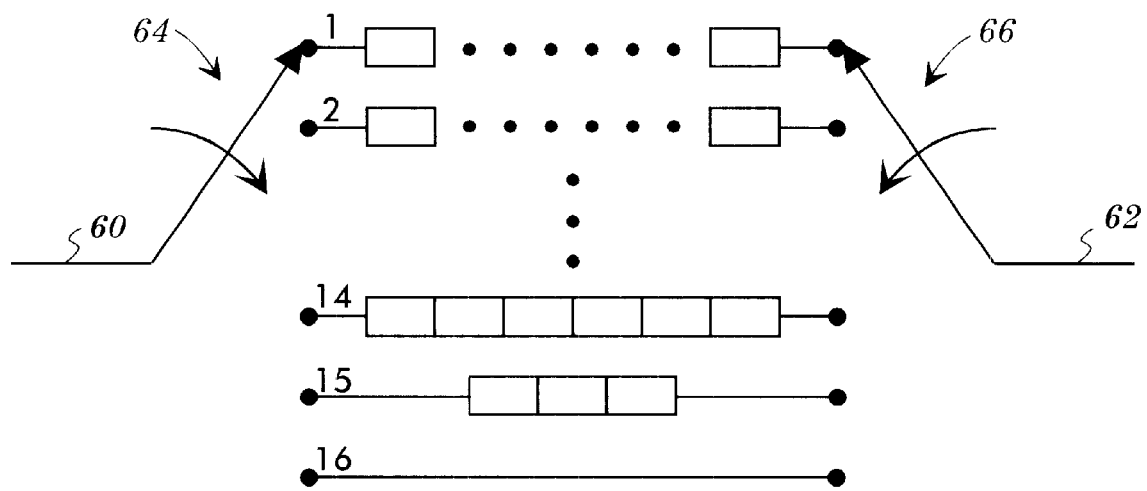
FIG. 5 shows an example of a convolutional de-interleaver that can be used in the receiver portion shown in FIG. 4.

An example of the convolutional de-interleaver 40 is shown in FIG. 5 and includes sixteen paths coupled between an input 60 and an output 62 by corresponding synchronized switching functions 64 and 66. As shown in FIG. 4, the input 60 is coupled to the A/D converter 34 and the output 62 is coupled to the averaging circuit 50. The switching functions 64 and 66 synchronously step through the sixteen paths on a data element-by-data element basis so that one data element received on the input 60 is coupled through the first path to the output 62, so that the next data element received on the input 60 is coupled through the second path to the output 62, and so on.

The first path of the convolutional de-interleaver 40 imposes a forty-five element delay on the data elements passing therethrough, the second path of the convolutional interleaver 14 imposes a forty-two delay on the data elements passing therethrough, . . . , the fourteenth path of the convolutional interleaver 14 imposes a six element delay on the data elements passing therethrough, the fifteenth path of the convolutional interleaver 14 imposes a three element delay on the data elements passing therethrough, and the sixteen path of the convolutional interleaver 14 imposes no delay on the data elements passing therethrough.

Figure 6:
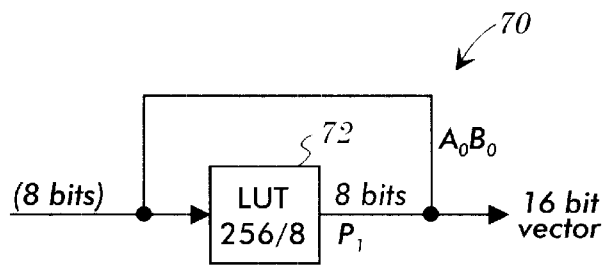
FIG. 6 shows a first embodiment of a Kerdock encoder that can be used in the map insertion system shown in FIG. 2.

A systematic Kerdock encoder 70 is shown in FIG. 6 and may be used for the Kerdock encoder 12. The systematic Kerdock encoder 70 accepts an input having N data elements, such as the map data sub-units $A_0$ and $B_0$ having a total of eight bits, and outputs a corresponding code word having 2N data elements, such as the code word $\{A_0\ B_0\ P_1\}$ having a total of sixteen bits, by appending N parity bits, such as the eight parity bits $P_1$, to the end of the N input data elements, such as the map data sub-units $A_0$ and $B_0$ having eight bits. The N parity data elements are read out of a look-up table 72 based on the N input data elements.

In the case where each map data sub-unit is four bits so that two map data sub-units are eight bits, the look-up table 72 stores 256 sets of parity bits where each set contains eight bits. Appendix A shows exemplary data for the look-up table 72. Each bit in this exemplary data has one of only two values, 1 or −1. In describing the relationship between the input bits and the sets of parity bits stored in the look-up table, it is useful to think of a bit having a value of −1 as a bit having a value of 0. The eight bits that are provided as an input to the systematic Kerdock encoder 70 are used as an address into the look-up table 72.

The data stored in the look-up table 72 are arranged so that, when a set of eight parity bits is read out according to eight input bits and is appended to the eight input bits, a Kerdock code word is formed. A Kerdock code word has a minimum distance of six from any other Kerdock code word. Distance is a measure of how many corresponding bits differ between two code words.

The relationship between the input bits and the bits stored in the look-up table 72 fosters the creation of the Kerdock code words that are output by the systematic Kerdock encoder 70. This relationship is as follows: the input bits having a value of −1 −1 −1 −1 −1 −1 −1 −1 (i.e., the address 0) are used to address the first row of Appendix A; the input bits having a value of −1 −1 −1 −1 −1 −1 −1 1 (i.e., the address 1) are used to address the second row of Appendix A; the input bits having a value of −1 −1 −1 −1 −1 −1 1 −1 (i.e., the address 2) are used to address the third row of Appendix A; the input bits having a value of −1 −1 −1 −1 −1 −1 1 1 (i.e., the address 3) are used to address the fourth row of Appendix A; and so on.

As an example, when the input −1 −1 −1 −1 −1 −1 −1 −1 is received by the systematic Kerdock encoder 70, the first row of Appendix A is read out from the look-up table 72 and is appended to this input to form the Kerdock code word −1 −1 −1 −1 −1 −1 −1 −1 1 −1 1 1 −1 1 −1. As another example, when the input −1 −1 −1 −1 −1 −1 −1 1 is received by the systematic Kerdock encoder 70, the second row of Appendix A is read out from the look-up table 72 and is appended to this input to form the Kerdock code word −1 −1 −1 −1 −1 −1 −1 1 1 −1 −1 −1 1 1 −1 −1. It is noted that these two Kerdock code words have a distance of six from each other because the eighth, ninth, tenth, twelfth, fourteenth, and fifteenth bits are different between the two Kerdock code words.

Figure 7:
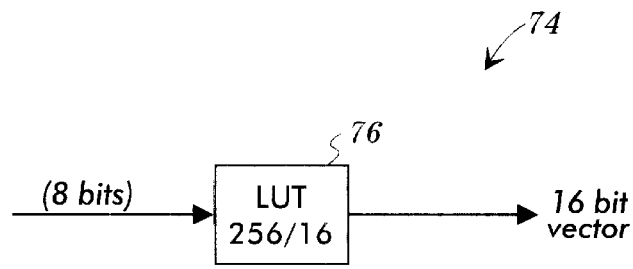
FIG. 7 shows a second embodiment of a Kerdock encoder that can be used in the map insertion system shown in FIG. 2.

Alternatively, a systematic Kerdock encoder 74 is shown in FIG. 7 and may be used for the Kerdock encoder 12. The systematic Kerdock encoder 74 accepts an input having N data elements, such as the map data sub-units $A_0$ and $B_0$ having a total of eight bits, and outputs a corresponding code word having 2N data elements, such as the code word $\{A_0 \ B_0 \ P_1\}$ having a total of sixteen bits, by reading out the 2N data element code word from a look-up table 76.

In the case where each map data sub-unit is four bits so that two map data sub-units are eight bits, the look-up table 76 stores 256 code words where each code word contains sixteen bits. Appendix B shows exemplary data for the look-up table 76. As in the case of Appendix A, each bit in this exemplary data has one of only two values, 1 or −1. The eight bits that are provided as an input to the systematic Kerdock encoder 74 are used as an address into the look-up table 76 and correspond to the first eight bits of a row in the data shown in Appendix B. The row of Appendix B that is addressed by a set of eight input bits is the row in which the first eight bits match the eight input bits. Each code word stored in the look-up table 76 is a Kerdock code word because each code word stored in the look-up table 76 has a minimum distance of six from any other Kerdock code word stored in the look-up table 76.

As an example, when the input −1 −1 −1 −1 −1 −1 −1 −1 is received by the systematic Kerdock encoder 74, a row 78 of Appendix A is read out from the look-up table 76. The row 78 contains the following bits: −1 −1 −1 −1 −1 −1 1 −1 1 1 −1 1 1 1 −1 1 −1. As another example, when the input −1 −1 −1 −1 −1 −1 −1 1 is received by the systematic Kerdock encoder 74, a row 80 of Appendix A is read out from the look-up table 76. The row 80 contains the following bits: −1 −1 −1 −1 −1 −1 −1 1 1 1 −1 −1 −1 1 1 −1 −1. It is noted that these two Kerdock code words have a distance of six from each other because the eighth, ninth, tenth, twelfth, fourteenth, and fifteenth bits are different between the two Kerdock code words.

Figure 8:
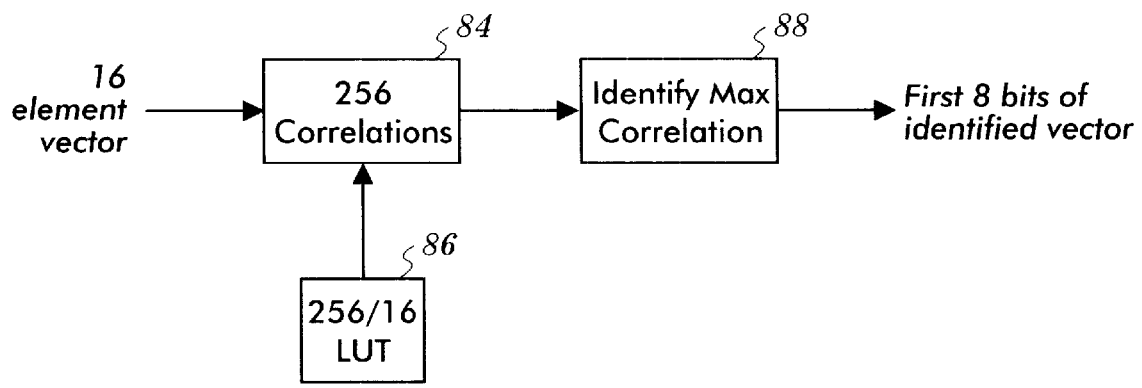
FIG. 8 shows a first embodiment of a Kerdock decoder that can be used in the receiver portion shown in FIG. 4.

A systematic Kerdock decoder 82 is shown in FIG. 8 and may be used for the Kerdock decoder 44. The systematic Kerdock decoder 82 accepts an input having 2N data elements, such as eight bits corresponding to the map data sub-units $A_0$ and $B_0$ and 8 bits corresponding to the parity bits, and outputs a vector of N data elements, such as the map data sub-units $A_0$ and $B_0$ having eight bits.

More specifically, a correlator 84 correlates the 2N input data elements with each of 256 Kerdock code words stored in a look-up table 86, where each Kerdock code word comprises sixteen data elements such as bits. Appendix B shows exemplary data for the look-up table 86. The correlation implemented by the correlator 84, for example, may be a cross product of the input 2N data elements and each of the Kerdock code words stored in the look-up table 86.

Thus, the first data element of the 2N input data elements is multiplied by the first data element of a first Kerdock code word stored in the look-up table 86 to form a first product, the second data element of the 2N input data elements is multiplied by the second data element of the first Kerdock code word stored in the look-up table 86 to form a second product, . . . , and the sixteenth data element of the 2N input data elements is multiplied by the sixteenth data element of the first Kerdock code word stored in the look-up table 86 to form a sixteenth product. The resulting sixteen products are added to form a first correlation between the 2N input data elements and the first Kerdock code word stored in the look-up table 86. This process is repeated for each of the other 255 Kerdock code words stored in the look-up table 86.

An identifier 88 identifies the Kerdock code word from the look-up table 86 that produced the largest correlation and outputs the first eight data elements of this Kerdock code word as the eight data elements making up two map data sub-units of a map data unit to be applied to the segment de-formatter 42. The identifier 88 may also form the difference between the largest correlation and the next largest correlation as a reliability factor that indicates the reliability with which the 2N input data elements have been decoded.

Figure 9:
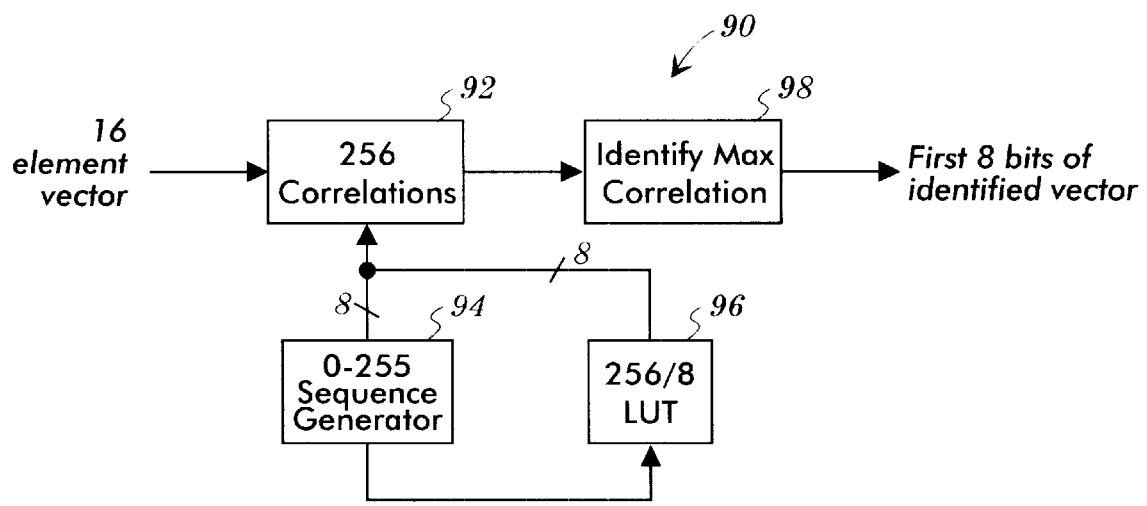
FIG. 9 shows a second embodiment of a Kerdock decoder that can be used in the receiver portion shown in FIG. 4.

Alternatively, a systematic Kerdock decoder 90 is shown in FIG. 9 and may be used for the Kerdock decoder 44. The systematic Kerdock decoder 90 accepts an input having 2N data elements, such as the map data sub-units $A_0$ and $B_0$ having eight bits and the corresponding eight parity bits $P_1$, and outputs a vector having N data elements, such as the map data sub-units $A_0$ and $B_0$ having eight bits.

More specifically, a correlator 92 correlates the 2N input data elements with each of 256 Kerdock code words that are supplied to the correlator 92 from a sequence generator 94 and a look-up table 96. Each Kerdock code word supplied to the correlator 92 from the sequence generator 94 and the look-up table 96 comprises sixteen data elements such as bits. The correlation implemented by the correlator 92, for example, may be the same correlation as implemented by the correlator 84.

The first eight bits of the first Kerdock code word supplied to the correlator 92 comprises a first sequence of eight bits generated by the sequence generator 94. For example, this first sequence may be −1 −1 −1 −1 −1 −1 −1 −1 (i.e., 0). The second eight bits of the first Kerdock code word supplied to the correlator 92 comprise eight bits read out of the look-up table 96 based on an address corresponding to the eight bits generated by the sequence generator 94. These two sets of eight bits are appended together and are supplied to the correlator 92.

Appendix A shows exemplary data for the look-up table 96. The relationship between the input bits from the sequence generator 94 and the bits stored in the look-up table 96 may be the same as that used by the systematic Kerdock encoder 70. Accordingly, the input bits having a value of −1 −1 −1 −1 −1 −1 −1 −1 (i.e., the address 0) are used to address the first row of Appendix A, the input bits having a value of −1 −1 −1 −1 −1 −1 −1 1 (i.e., the address 1) are used to address the second row of Appendix A, and so on.

The correlator 92 produces a first correlation based upon the input 2N bits and the first Kerdock code word produced by the sequence generator 94 and the look-up table 96.

The first eight bits of the second Kerdock code word supplied to the correlator 92 comprises a second sequence of eight bits generated by the sequence generator 94. For example, this second sequence may be −1 −1 −1 −1 −1 −1 −1 1 (i.e., 1). The second eight bits of the second Kerdock code word supplied to the correlator 92 comprise eight bits read out of the look-up table 96 based on an address corresponding to the eight bits generated by the sequence generator 94. These two sets of eight bits are appended together and are supplied to the correlator 92.

The correlator 92 produces a second correlation based upon the input 2N bits and the second Kerdock code word produced by the sequence generator 94 and the look-up table 96, and so on.

An identifier 98 identifies the Kerdock code word from the sequence generator 94 and the look-up table 96 that produced the largest correlation and outputs the first eight data elements of this Kerdock code word as the eight data elements making up two map data sub-units of a map data unit to be applied to the segment de-formatter 42. The identifier 98 may also form the difference between the largest correlation and the next largest correlation as a reliability factor indicating the reliability with which the 2N input data elements have been decoded.

Figure 10:
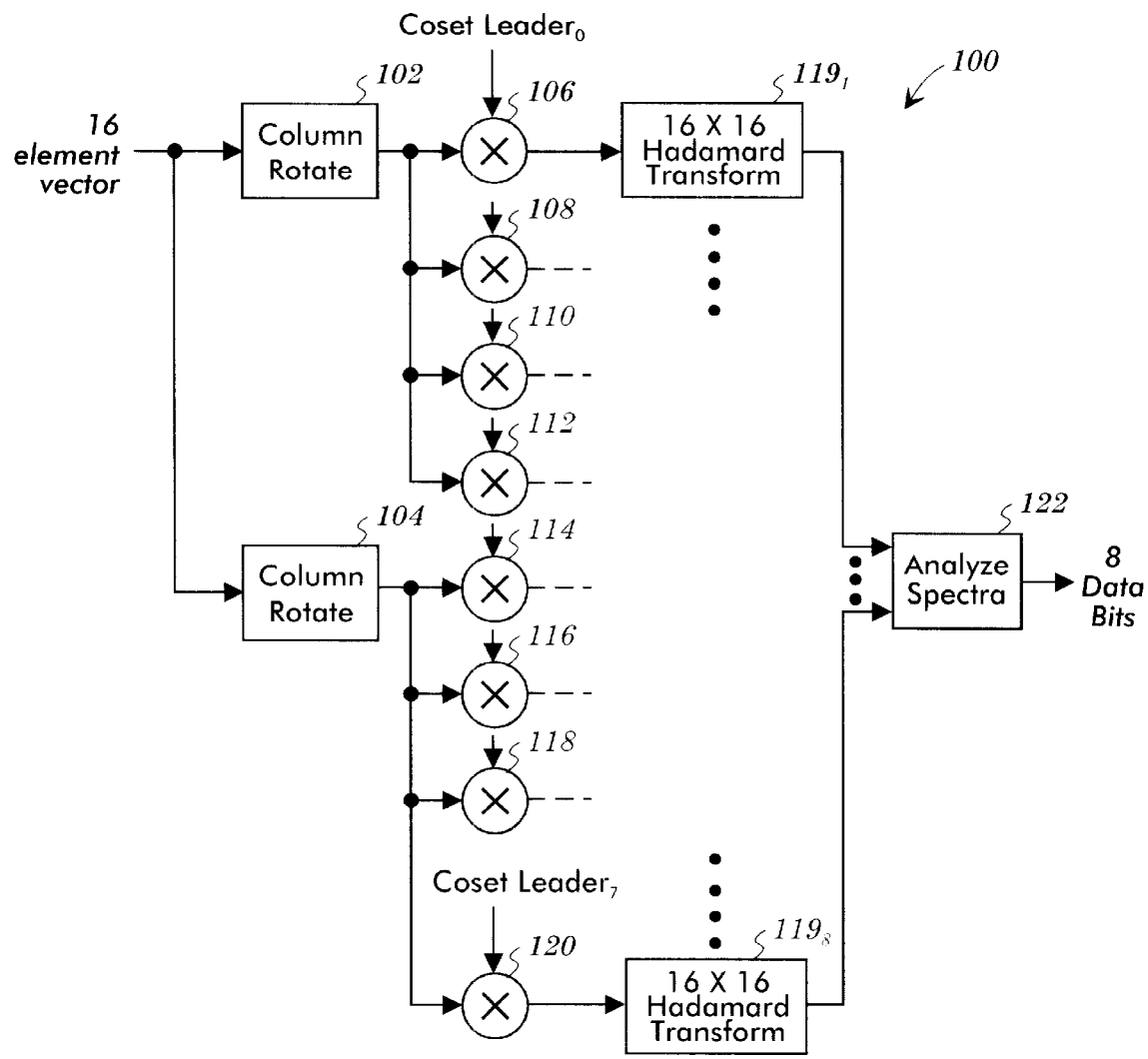
FIG. 10 shows a third embodiment of a Kerdock decoder that can be used in the receiver portion shown in FIG. 4; and, FIGS. 11A and 11B are flow charts illustrating the operation of the receiver portion shown in FIG. 4.

As a further alternative, a systematic decoder 100 shown in FIG. 10 may be used for the Kerdock decoder 44. The systematic decoder 100 is a modified form of the non-systematic decoder disclosed in U.S. Pat. No. 6,226,318 B1. The systematic decoder 100 includes two column rotators 102 and 104, and eight vector multipliers 106, 108, 110, 112, 114, 116, 118, and 120. The modification involves the addition of the two column rotators to the non-systematic decoder disclosed in U.S. Pat. No. 6,226,318 B1.

Appendix C shows the coset leaders that are applied to first inputs of the multipliers 106, 108, 110, 112, 114, 116, 118, and 120. Accordingly, the coset leader in the first row of Appendix C is applied to the first input of the multiplier 106, the coset leader in the second row of Appendix C is applied to the first input of the multiplier 108, the coset leader in the third row of Appendix C is applied to the first input of the multiplier 110, . . . , and the coset leader in the eighth row of Appendix C is applied to the first input of the multiplier 120.

The input sixteen data elements to be decoded are re-arranged (such as rotated) according to the first column of the following table and this rotated input is applied to each of the second inputs of the multipliers 106, 108, 110, and 112. The input to be decoded is rotated according to the second column of the following table and this rotated input is applied to each of the second inputs of the multipliers 114, 116, 118, and 120.

TABLE

| | |
|---|---|
| 4"1 | 4"1 |
| 15"2 | 15"2 |
| 14"3 | 14"3 |
| 9"4 | 9"4 |
| 5"5 | 6"5 |
| 12"6 | 11"6 |
| 7"7 | 8"7 |
| 2"8 | 1"8 |
| 3"9 | 3"9 |
| 16"10 | 16"10 |
| 13"11 | 13"11 |
| 10"12 | 10"12 |
| 6"13 | 5"13 |
| 11"14 | 12"14 |
| 8"15 | 7"15 |
| 1"16 | 2"16 |

According to the first column of the above table, the fourth input data element is moved to the first data element position of the output to be supplied to the second inputs of the multipliers 106, 108, 110, and 112, the fifteenth input data element is moved to the second data element position of the output to be supplied to the second inputs of the multipliers 106, 108, 110, and 112, the fourteenth input data element is moved to the third data element position of the output to be supplied to the second inputs of the multipliers 106, 108, 110, and 112, . . . , and the first input data element is moved to the sixteenth data element position of the output to be supplied to the second inputs of the multipliers 106, 108, 110, and 112. Accordingly, the sixteen data element input is rotated by the column rotator 102 to form a sixteen data element output to be supplied to the second inputs of the multipliers 106, 108, 110, and 112.

Similarly, the second column of the above table shows the rotation imposed by the column rotator 104 on the sixteen input data elements to form a sixteen data element output to be supplied to the second inputs of the multipliers 114, 116, 118, and 120. The column rotators 102 and 104 in effect convert a systematic code vector to a non-systematic code vector.

The outputs of the multipliers 106, 108, 110, 112, 114, 116, 118, and 120 are processed by a corresponding one of 16×16 Hadamard transforms $119_1$–$119_8$ to produce corresponding spectra that are analyzed by a spectral analyzer 122. The spectral analyzer 122 determines which spectra contains the largest coefficient and decodes the largest coefficient to produce the corresponding Kerdock code word. The first eight bits of this Kerdock code word are supplied by the spectral analyzer 122 as the eight data elements making up two map data sub-units of a map data unit to be applied to the segment de-formatter 42. The spectral analyzer 122 may also form the difference between the largest coefficient and the next largest coefficient as a reliability factor indicating the reliability with which the 2N input data elements have been decoded.

Figures 11A, 11B:
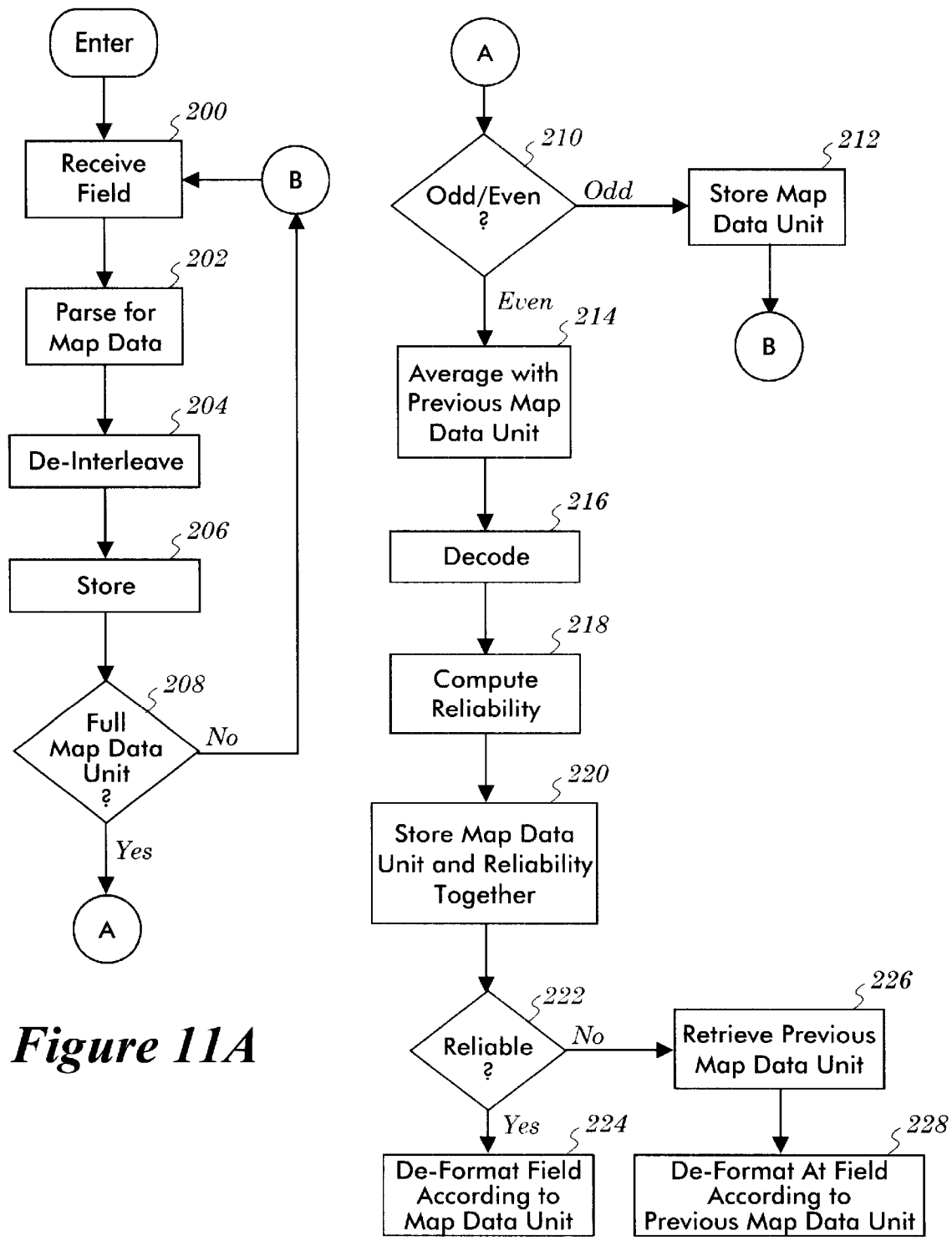

The receiving arrangement shown in FIG. 4 performs the functions illustrated by the flow chart of FIGS. 11A and 11B. A block 200 receives a field, and a block 202 parses the field in order to recover the map data unit symbols. A block 204 de-interleaves the map data unit symbols, and a block 206 stores the de-interleaved map data unit symbols in a memory. When a full map data unit has been de-interleaved as determined by a block 208, a block 210 determines whether this map data unit corresponds to an odd field or an even field. If the block 210 determines that this map data unit corresponds to an odd field, a block 212 simply stores the map data unit awaiting de-interleaving and decoding of the duplicate of this data map unit because data map units transmitted in odd fields are duplicated in even fields. After the non-duplicate map data unit is stored by the block 212, flow returns to the block 200.

If the block 210 determines that this map data unit corresponds to an even field, the recovered map data unit is a duplicate of the map data unit previously de-interleaved and decoded. Accordingly, a block 214 averages the current map data unit and the previous map data unit. A block 216 decodes the map data unit average, and a block 218 computes a reliability factor for the map data unit average. A block 220 stores the average map and the corresponding reliability factor.

A block 222 determines whether the reliability factor of a decoded map data unit corresponding to the field received at the block 200 indicates that the decoded map data unit has been reliably decoded. If the reliability factor indicates reliable decoding, a block 224 de-formats the field corresponding to the appropriate map data unit and sends the VSB data and/or the E-VSB data to the VSB processor 46 and/or the E-VSB processor 48, as appropriate, in accordance with the de-formatting.

On the other hand, if the reliability factor indicates that the decoding was not reliable as determined at the block 222, a block 226 retrieves the immediately previous map data unit that was reliably decoded, and a block 228 de-formats the field in accordance with the retrieved immediately previous map data unit and sends the VSB data and/or the E-VSB data to the VSB processor 46 and/or the E-VSB processor 48, as appropriate, in accordance with the de-formatting.

APPENDIX A

{ -1, 1, -1, 1, 1, -1, 1, -1, },
{ 1, -1, -1, -1, 1, 1, -1, -1, },
{ 1, -1, 1, 1, -1, -1, 1, 1, },
{ -1, 1, 1, -1, -1, 1, -1, 1, },
{ -1, -1, -1, -1, -1, -1, -1, 1, },
{ -1, 1, 1, -1, 1, -1, 1, 1, },
{ 1, 1, -1, 1, -1, 1, -1, -1, },
{ -1, -1, 1, 1, 1, 1, 1, -1, },
{ 1, 1, 1, 1, 1, -1, 1, },
{ -1, -1, -1, 1, -1, 1, 1, 1, },
{ -1, -1, 1, -1, 1, -1, -1, -1, },
{ 1, -1, -1, -1, -1, 1, -1, },
{ 1, -1, 1, -1, -1, 1, 1, -1, },
{ -1, 1, 1, 1, -1, -1, -1, -1, },
{ -1, 1, -1, -1, 1, 1, 1, 1, },
{ 1, -1, -1, 1, 1, -1, -1, 1, },
{ 1, 1, 1, -1, -1, -1, -1, -1, },
{ -1, -1, 1, 1, 1, -1, -1, 1, },
{ -1, -1, -1, -1, -1, 1, 1, -1, },
{ 1, 1, -1, 1, 1, 1, 1, },
{ -1, 1, 1, 1, -1, 1, 1, 1, },
{ 1, -1, 1, -1, -1, 1, -1, },
{ 1, -1, 1, -1, 1, 1, -1, 1, },
{ -1, 1, -1, -1, 1, -1, -1, -1, },
{ 1, -1, -1, -1, 1, -1, 1, 1, },
{ -1, 1, 1, -1, 1, 1, 1, -1, },
{ -1, 1, -1, 1, -1, -1, -1, 1, },
{ 1, -1, 1, 1, -1, 1, -1, -1, },
{ -1, -1, -1, 1, 1, 1, -1, -1, },
{ 1, 1, -1, -1, 1, -1, 1, 1, },
{ 1, 1, 1, 1, -1, 1, -1, },
{ -1, -1, 1, -1, -1, -1, 1, 1, },
{ -1, -1, 1, -1, 1, 1, 1, 1, },
{ 1, 1, 1, -1, 1, 1, -1, },
{ 1, 1, -1, -1, 1, -1, -1, 1, },

-continued

APPENDIX A

{ -1, -1, -1, 1, -1, -1, -1, -1, },
{ 1, -1, 1, 1, 1, -1, -1, -1, },
{ -1, 1, -1, 1, 1, 1, -1, 1, },
{ -1, 1, 1, -1, -1, -1, 1, -1, },
{ 1, -1, -1, -1, -1, 1, 1, 1, },
{ -1, 1, -1, -1, -1, 1, -1, -1, },
{ 1, -1, 1, -1, -1, -1, -1, 1, },
{ 1, -1, -1, 1, 1, 1, 1, -1, },
{ -1, 1, 1, 1, 1, -1, 1, 1, },
{ 1, 1, -1, 1, -1, -1, 1, 1, },
{ -1, -1, -1, -1, 1, -1, 1, -1, },
{ -1, -1, 1, 1, -1, 1, -1, 1, },
{ 1, 1, 1, -1, 1, 1, -1, -1, },
{ 1, -1, -1, 1, -1, -1, 1, 1, },
{ -1, 1, -1, -1, -1, -1, 1, 1, },
{ -1, 1, 1, 1, 1, 1, -1, -1, },
{ 1, -1, 1, -1, 1, 1, 1, -1, },
{ 1, -1, -1, 1, 1, 1, -1, },
{ -1, -1, -1, -1, 1, -1, -1, },
{ -1, -1, -1, 1, 1, 1, -1, 1, },
{ 1, 1, 1, 1, -1, -1, -1, },
{ -1, 1, 1, -1, 1, 1, -1, -1, },
{ 1, -1, 1, 1, -1, 1, -1, 1, },
{ 1, -1, -1, -1, 1, -1, 1, -1, },
{ -1, 1, -1, 1, -1, -1, 1, 1, },
{ 1, -1, -1, 1, 1, -1, -1, -1, },
{ -1, 1, -1, 1, -1, -1, 1, 1, },
{ 1, -1, -1, 1, 1, -1, -1, -1, },
{ -1, 1, -1, -1, 1, -1, -1, 1, },
{ 1, 1, -1, -1, 1, 1, 1, -1, },
{ 1, -1, 1, -1, 1, 1, 1, 1, },
{ -1, -1, 1, 1, 1, -1, 1, 1, },
{ 1, 1, -1, 1, 1, 1, 1, -1, },
{ 1, 1, 1, -1, -1, -1, -1, 1, },
{ -1, -1, -1, -1, -1, 1, -1, -1, },
{ 1, -1, 1, 1, 1, 1, 1, -1, },
{ -1, 1, -1, 1, -1, 1, -1, 1, },
{ -1, 1, 1, -1, 1, -1, 1, 1, },
{ 1, -1, -1, -1, -1, -1, 1, 1, },
{ 1, 1, -1, 1, 1, -1, -1, 1, },
{ -1, -1, -1, -1, 1, 1, 1, 1, },
{ -1, -1, 1, 1, -1, -1, -1, -1, },
{ 1, 1, 1, -1, -1, 1, 1, -1, },
{ -1, -1, 1, -1, -1, 1, -1, 1, },
{ 1, 1, 1, -1, 1, 1, 1, },
{ 1, -1, -1, -1, 1, 1, 1, -1, },
{ -1, 1, 1, -1, -1, 1, 1, -1, },
{ -1, -1, 1, -1, -1, 1, -1, 1, },
{ -1, 1, -1, -1, -1, 1, 1, -1, },
{ -1, -1, 1, -1, 1, 1, 1, -1, },
{ 1, 1, -1, -1, -1, -1, -1, -1, },
{ 1, 1, 1, 1, 1, 1, 1, },
{ -1, -1, -1, 1, -1, -1, 1, },
{ 1, 1, 1, -1, 1, -1, 1, 1, },
{ -1, -1, 1, 1, 1, 1, -1, -1, },
{ -1, -1, -1, -1, -1, 1, 1, 1, },
{ 1, 1, -1, 1, -1, 1, -1, 1, },
{ 1, -1, -1, 1, 1, -1, 1, 1, },
{ -1, 1, 1, -1, -1, 1, 1, 1, },
{ -1, 1, -1, 1, 1, -1, -1, -1, },
{ 1, -1, 1, -1, -1, 1, 1, -1, },

APPENDIX A

{ -1, -1, -1, -1, 1, -1, -1, -1, },
{ 1, 1, 1, -1, 1, 1, -1, 1, },
{ 1, 1, -1, 1, -1, -1, 1, -1, },
{ -1, -1, 1, 1, -1, 1, 1, 1, },
{ 1, -1, 1, -1, -1, -1, 1, 1, },
{ -1, 1, 1, 1, 1, -1, 1, -1, },
{ -1, 1, -1, -1, -1, 1, -1, 1, },
{ 1, -1, -1, 1, 1, 1, -1, -1, },
{ -1, -1, 1, 1, 1, 1, 1, 1, },
{ 1, -1, -1, -1, -1, 1, 1, -1, },
{ 1, -1, 1, 1, 1, -1, -1, 1, },
{ -1, 1, 1, -1, -1, -1, -1, -1, },
{ 1, 1, 1, 1, -1, 1, -1, -1, },
{ -1, -1, -1, 1, -1, -1, 1, 1, },
{ -1, -1, 1, -1, 1, 1, 1, -1, },
{ 1, 1, -1, -1, 1, -1, 1, 1, },
{ -1, -1, 1, 1, -1, 1, -1, -1, },
{ -1, 1, -1, 1, -1, -1, -1, 1, },
{ 1, 1, 1, -1, 1, 1, 1, -1, },
{ -1, -1, -1, -1, 1, -1, 1, 1, },
{ 1, -1, -1, 1, 1, 1, 1, 1, },
{ -1, 1, -1, -1, -1, 1, -1, 1, },
{ -1, 1, 1, 1, 1, -1, -1, 1, },
{ 1, -1, 1, -1, -1, -1, -1, -1, },
{ -1, 1, 1, -1, -1, -1, 1, 1, },
{ 1, 1, 1, 1, 1, -1, -1, 1, },
{ 1, -1, -1, -1, -1, 1, -1, 1, },
{ -1, 1, -1, 1, 1, 1, -1, -1, },
{ 1, 1, -1, -1, 1, -1, -1, -1, },
{ -1, 1, 1, -1, 1, -1, 1, 1, },
{ -1, -1, -1, -1, 1, -1, 1, -1, },
{ 1, 1, 1, 1, -1, 1, 1, 1, },
{ -1, 1, -1, -1, 1, 1, -1, 1, },
{ 1, -1, 1, -1, -1, 1, 1, 1, },
{ 1, -1, -1, 1, 1, -1, -1, -1, },
{ -1, 1, 1, 1, -1, 1, -1, 1, },
{ -1, -1, 1, -1, 1, -1, 1, -1, },
{ 1, 1, 1, 1, 1, -1, 1, -1, },
{ 1, 1, -1, -1, -1, 1, 1, 1, },
{ -1, -1, -1, 1, -1, 1, -1, 1, },
{ 1, 1, -1, 1, -1, 1, 1, -1, },
{ -1, -1, -1, -1, -1, -1, -1, -1, },
{ -1, 1, 1, 1, 1, 1, 1, 1, },
{ 1, 1, 1, -1, 1, -1, -1, 1, },
{ 1, -1, 1, 1, -1, -1, -1, 1, },
{ -1, 1, -1, 1, 1, -1, 1, 1, },
{ -1, 1, 1, -1, 1, -1, -1, -1, },
{ 1, -1, -1, -1, 1, 1, 1, -1, },
{ 1, -1, -1, -1, -1, -1, 1, -1, },
{ -1, 1, 1, -1, 1, -1, -1, -1, },
{ -1, 1, 1, 1, -1, 1, 1, 1, },
{ 1, -1, 1, 1, 1, 1, -1, 1, },
{ 1, 1, 1, -1, -1, 1, -1, 1, },
{ -1, -1, 1, 1, -1, -1, 1, 1, },
{ -1, -1, -1, 1, 1, -1, -1, -1, },
{ 1, 1, -1, 1, 1, -1, 1, -1, },
{ -1, -1, -1, 1, 1, -1, -1, 1, },
{ 1, 1, -1, -1, 1, 1, 1, 1, },
{ 1, 1, 1, -1, -1, -1, -1, -1, },
{ -1, -1, -1, -1, 1, 1, -1, 1, },
{ -1, 1, 1, 1, 1, 1, 1, -1, },
{ 1, -1, -1, 1, -1, 1, -1, -1, },
{ 1, -1, 1, -1, 1, -1, 1, 1, },
{ -1, -1, -1, -1, -1, 1, 1, 1, },
{ 1, 1, -1, 1, -1, -1, -1, -1, },
{ -1, 1, -1, -1, 1, -1, -1, 1, },
{ 1, -1, 1, 1, -1, 1, 1, -1, },
{ -1, 1, 1, 1, -1, -1, 1, 1, },
{ 1, -1, -1, -1, 1, -1, -1, 1, },
{ 1, -1, 1, 1, -1, 1, 1, -1, },
{ -1, 1, 1, 1, 1, 1, 1, 1, },
{ 1, -1, 1, -1, 1, -1, -1, 1, },
{ -1, 1, 1, 1, 1, 1, 1, 1, },
{ -1, 1, -1, -1, -1, -1, -1, -1, },
{ 1, -1, -1, 1, -1, 1, 1, 1, },
{ 1, 1, 1, 1, -1, -1, 1, 1, },
{ -1, 1, -1, -1, -1, -1, -1, -1, },
{ -1, -1, 1, 1, 1, -1, -1, 1, },
{ 1, 1, -1, 1, 1, 1, 1, 1, },
{ 1, 1, 1, -1, -1, -1, -1, 1, },
{ -1, -1, 1, -1, -1, 1, 1, -1, },
{ -1, 1, 1, 1, 1, 1, 1, -1, },
{ 1, -1, -1, 1, -1, 1, -1, -1, },
{ 1, -1, -1, -1, 1, -1, -1, 1, },
{ -1, 1, -1, -1, 1, 1, -1, 1, },
{ -1, 1, 1, 1, 1, 1, -1, 1, },
{ 1, -1, 1, 1, 1, -1, -1, -1, },
{ 1, -1, 1, 1, -1, -1, -1, -1, },
{ -1, 1, 1, -1, 1, -1, -1, 1, },
{ 1, -1, 1, -1, -1, -1, -1, -1, },
{ 1, 1, 1, -1, 1, -1, -1, -1, },
{ -1, 1, 1, -1, 1, 1, -1, 1, },
{ 1, 1, -1, -1, -1, -1, 1, 1, },
{ -1, -1, 1, 1, 1, 1, -1, 1, },
{ 1, -1, -1, -1, -1, -1, 1, -1, },
{ -1, 1, 1, -1, -1, 1, -1, 1, },
{ 1, 1, 1, -1, 1, 1, 1, 1, },
{ -1, 1, -1, -1, -1, 1, 1, 1, },
{ -1, 1, -1, -1, 1, 1, 1, 1, },
{ 1, 1, 1, 1, -1, 1, -1, 1, },
{ -1, -1, 1, 1, -1, -1, -1, 1, },
{ 1, 1, -1, 1, -1, -1, -1, -1, },
{ 1, 1, 1, -1, 1, 1, 1, 1, },
{ -1, 1, -1, 1, 1, -1, 1, 1, },
{ 1, -1, 1, 1, 1, 1, -1, 1, },
{ -1, -1, 1, 1, -1, -1, 1, -1, },
{ 1, 1, -1, -1, -1, 1, -1, -1, },
{ 1, 1, -1, 1, 1, 1, -1, 1, },
{ -1, -1, 1, -1, -1, -1, 1, -1, },
{ 1, -1, 1, 1, -1, -1, 1, 1, },
{ -1, -1, 1, -1, 1, -1, -1, -1, },
{ 1, 1, 1, 1, 1, 1, 1, 1, },
{ 1, -1, -1, -1, 1, -1, 1, -1, },
{ -1, 1, -1, 1, 1, -1, -1, 1, },
{ 1, -1, 1, 1, 1, 1, -1, -1, },
{ -1, -1, 1, 1, -1, -1, -1, 1, },
{ -1, -1, -1, 1, -1, 1, 1, -1, },
{ 1, 1, -1, -1, -1, -1, 1, -1, },
{ 1, -1, -1, 1, 1, -1, 1, -1, },
{ -1, 1, -1, -1, 1, 1, -1, -1, },
{ -1, 1, 1, 1, -1, 1, 1, 1, },
{ 1, -1, 1, -1, -1, 1, -1, 1, },

APPENDIX B

{ 1, -1, -1, -1, 1, 1, 1, 1, 1, 1, -1, 1, 1, 1, },
{ -1, 1, -1, -1, 1, 1, 1, 1, -1, -1, -1, -1, -1, 1, -1, -1, },

APPENDIX B

```
{ -1, 1, -1, -1, 1, 1, -1, -1, -1, -1, 1, 1, 1, -1, 1, 1, },
{ 1, -1, -1, -1, 1, 1, -1, -1, 1, 1, -1, -1, 1, -1, -1, -1, },
{ -1, 1, -1, -1, -1, -1, -1, -1, 1, 1, -1, -1, -1, 1, 1, 1, },
{ 1, -1, -1, -1, -1, -1, -1, -1, -1, 1, 1, 1, -1, 1, -1, -1, },
{ 1, -1, -1, -1, -1, -1, 1, 1, -1, -1, -1, -1, 1, 1, 1, 1, },
{ -1, 1, -1, -1, -1, -1, 1, 1, 1, 1, 1, 1, -1, -1, -1, 1, },
{ -1, -1, 1, -1, 1, -1, 1, -1, 1, -1, -1, 1, 1, 1, -1, 1, },
{ 1, 1, 1, -1, 1, -1, 1, -1, -1, 1, 1, -1, 1, 1, -1, 1, },
{ 1, 1, 1, -1, 1, -1, -1, 1, -1, 1, -1, 1, -1, -1, 1, -1, },
{ -1, -1, 1, -1, 1, -1, 1, 1, -1, 1, -1, -1, -1, -1, 1, },
{ 1, 1, 1, -1, -1, 1, -1, 1, 1, -1, 1, -1, 1, 1, 1, -1, },
{ -1, -1, 1, -1, -1, 1, -1, 1, -1, 1, -1, 1, 1, 1, -1, 1, },
{ -1, -1, 1, -1, -1, 1, 1, 1, 1, 1, 1, -1, 1, -1, -1, },
{ 1, 1, 1, -1, -1, 1, -1, -1, -1, 1, -1, -1, -1, 1, 1, },
{ 1, 1, -1, -1, 1, 1, 1, 1, -1, 1, 1, -1, 1, -1, 1, -1, },
{ -1, -1, -1, -1, 1, 1, 1, 1, -1, -1, 1, 1, -1, -1, 1, 1, },
{ -1, -1, -1, -1, 1, 1, -1, -1, 1, -1, 1, -1, -1, 1, 1, -1, },
{ 1, 1, -1, -1, 1, 1, 1, 1, 1, 1, -1, 1, 1, -1, 1, -1, },
{ -1, -1, -1, -1, -1, -1, -1, -1, 1, -1, 1, 1, -1, 1, -1, },
{ 1, 1, -1, -1, -1, -1, -1, -1, 1, -1, 1, 1, -1, 1, -1, -1, },
{ 1, -1, -1, -1, -1, -1, 1, 1, -1, -1, 1, -1, 1, 1, 1, -1, },
{ -1, -1, -1, -1, -1, 1, 1, -1, -1, -1, -1, -1, 1, 1, 1, },
{ -1, 1, 1, -1, 1, -1, 1, -1, -1, -1, -1, -1, -1, 1, 1, },
{ 1, -1, 1, -1, 1, -1, 1, 1, 1, 1, 1, -1, -1, -1, 1, },
{ 1, -1, 1, -1, 1, -1, 1, 1, 1, -1, -1, 1, 1, 1, 1, },
{ -1, 1, 1, -1, 1, -1, 1, -1, 1, -1, 1, 1, 1, 1, 1, },
{ 1, -1, 1, -1, -1, 1, -1, 1, -1, 1, 1, -1, 1, 1, 1, },
{ -1, 1, 1, -1, -1, 1, -1, 1, 1, 1, -1, -1, -1, -1, -1, },
{ -1, 1, 1, -1, -1, 1, 1, -1, 1, 1, 1, 1, 1, 1, 1, },
{ 1, -1, 1, -1, 1, -1, -1, -1, -1, -1, 1, -1, -1, 1, -1, },
{ 1, 1, -1, -1, 1, 1, -1, 1, 1, -1, -1, -1, -1, 1, 1, },
{ -1, -1, -1, -1, 1, 1, -1, 1, -1, 1, 1, -1, -1, -1, -1, },
{ -1, -1, -1, -1, 1, 1, 1, -1, 1, -1, 1, -1, 1, 1, 1, },
{ 1, 1, -1, -1, 1, 1, 1, 1, -1, 1, 1, 1, 1, -1, 1, -1, },
{ -1, -1, -1, -1, -1, 1, -1, 1, -1, 1, 1, -1, 1, 1, },
{ 1, 1, -1, -1, -1, -1, 1, -1, -1, 1, -1, -1, -1, -1, -1, },
{ 1, 1, -1, -1, -1, -1, -1, 1, -1, 1, 1, 1, 1, 1, 1, },
{ -1, -1, -1, -1, -1, -1, -1, -1, 1, -1, 1, -1, 1, 1, -1, },
{ -1, 1, 1, -1, 1, -1, 1, 1, 1, 1, 1, 1, 1, 1, -1, },
{ 1, -1, 1, -1, 1, -1, -1, -1, -1, -1, 1, 1, -1, 1, 1, },
{ 1, -1, 1, -1, 1, -1, -1, 1, -1, 1, -1, 1, 1, -1, 1, },
{ -1, 1, 1, -1, -1, 1, 1, 1, 1, 1, -1, 1, 1, -1, 1, },
{ 1, -1, 1, -1, 1, -1, 1, -1, -1, -1, 1, -1, 1, 1, -1, 1, },
{ -1, 1, 1, -1, -1, 1, 1, 1, -1, -1, -1, -1, -1, 1, 1, },
{ -1, 1, 1, -1, -1, 1, -1, -1, -1, -1, 1, -1, 1, 1, -1, },
{ 1, -1, 1, -1, -1, 1, -1, 1, 1, 1, -1, -1, 1, -1, 1, },
{ -1, 1, -1, -1, 1, 1, -1, -1, 1, 1, -1, -1, -1, -1, 1, },
{ 1, -1, 1, -1, 1, 1, 1, -1, 1, -1, 1, 1, 1, -1, 1, -1, },
{ -1, 1, -1, -1, -1, -1, 1, -1, -1, 1, 1, 1, 1, -1, 1, },
{ -1, 1, -1, -1, -1, -1, -1, 1, -1, 1, -1, -1, -1, 1, -1, },
{ 1, -1, -1, -1, -1, -1, -1, 1, 1, 1, -1, 1, -1, -1, 1, },
{ 1, 1, 1, -1, 1, 1, -1, 1, -1, 1, 1, 1, 1, 1, 1, },
{ -1, -1, 1, -1, 1, -1, -1, -1, 1, -1, -1, -1, 1, -1, -1, },
{ -1, -1, 1, -1, -1, 1, 1, -1, 1, 1, 1, 1, -1, 1, 1, },
{ 1, 1, 1, -1, 1, -1, 1, 1, 1, -1, -1, -1, 1, -1, -1, -1, },
{ -1, -1, 1, -1, -1, 1, 1, 1, -1, 1, 1, 1, -1, -1, 1, },
{ 1, 1, 1, -1, -1, 1, -1, 1, 1, 1, -1, 1, -1, -1, 1, },
{ 1, 1, 1, -1, 1, -1, -1, 1, -1, 1, 1, 1, -1, 1, 1, },
{ -1, -1, 1, -1, -1, 1, -1, -1, 1, -1, 1, 1, -1, -1, -1, },
{ 1, 1, -1, -1, -1, 1, -1, 1, -1, 1, -1, 1, 1, 1, 1, },
{ -1, -1, -1, -1, -1, 1, 1, -1, -1, -1, 1, -1, 1, 1, 1, },
{ -1, -1, -1, -1, 1, 1, 1, -1, 1, -1, 1, 1, -1, 1, 1, },
{ 1, 1, -1, -1, -1, 1, -1, 1, -1, 1, 1, -1, -1, -1, -1, },
{ -1, -1, -1, -1, 1, -1, 1, -1, -1, -1, -1, 1, 1, 1, 1, },
{ 1, 1, -1, -1, 1, 1, -1, 1, 1, 1, 1, 1, 1, 1, -1, },
{ 1, 1, -1, -1, 1, 1, -1, -1, -1, -1, 1, -1, 1, 1, -1, },
{ -1, 1, 1, -1, 1, 1, 1, 1, 1, 1, -1, -1, 1, -1, 1, },
{ 1, -1, 1, -1, 1, 1, 1, -1, -1, -1, -1, 1, -1, 1, 1, }
{ -1, 1, 1, -1, 1, 1, 1, 1, 1, 1, -1, -1, 1, -1, 1, },
{ 1, -1, 1, -1, 1, 1, 1, -1, 1, -1, -1, -1, -1, 1, 1, },
{ -1, 1, -1, -1, -1, -1, 1, 1, -1, 1, -1, -1, 1, 1, -1, },
{ 1, -1, 1, -1, -1, 1, 1, 1, -1, 1, 1, 1, -1, 1, 1, },
{ 1, -1, -1, -1, -1, -1, -1, -1, 1, -1, -1, -1, -1, -1, 1, -1, },
```

APPENDIX B

```
{ -1, 1, 1, -1, -1, -1, -1, -1, -1, 1, 1, 1, -1, -1, -1, 1, },
{ -1, 1, -1, -1, -1, 1, 1, -1, 1, -1, -1, -1, 1, -1, 1, -1, },
{ 1, -1, -1, -1, -1, 1, 1, -1, -1, 1, 1, 1, 1, -1, -1, 1, },
{ 1, -1, -1, -1, -1, 1, 1, -1, 1, -1, -1, -1, 1, 1, -1, -1, },
{ -1, 1, -1, -1, -1, 1, 1, 1, 1, 1, 1, -1, 1, 1, 1, 1, },
{ 1, -1, -1, -1, 1, -1, 1, 1, -1, 1, 1, 1, 1, -1, 1, -1, },
{ -1, 1, -1, -1, 1, 1, -1, -1, 1, -1, 1, -1, -1, -1, 1, },
{ -1, 1, -1, -1, 1, -1, 1, -1, 1, 1, 1, -1, 1, 1, 1, },
{ 1, -1, -1, -1, -1, -1, 1, -1, -1, -1, -1, 1, 1, 1, 1, },
{ -1, -1, 1, -1, 1, 1, -1, -1, 1, 1, -1, -1, 1, 1, 1, },
{ 1, 1, 1, -1, 1, 1, 1, -1, -1, -1, 1, 1, 1, 1, 1, },
{ -1, 1, 1, -1, 1, 1, 1, 1, 1, 1, -1, -1, -1, -1, 1, -1, },
{ 1, 1, -1, -1, -1, -1, 1, 1, 1, 1, -1, 1, 1, 1, -1, -1, },
{ -1, -1, 1, -1, -1, -1, -1, 1, -1, -1, -1, -1, 1, 1, 1, },
{ -1, -1, 1, -1, -1, -1, -1, -1, -1, -1, 1, -1, 1, 1, 1, },
{ 1, 1, 1, -1, -1, -1, -1, 1, 1, -1, 1, 1, 1, -1, -1, },
{ 1, 1, 1, -1, -1, -1, 1, -1, 1, -1, 1, 1, -1, -1, 1, },
{ 1, -1, -1, -1, 1, 1, 1, 1, -1, 1, -1, -1, -1, -1, -1, },
{ 1, -1, -1, -1, 1, -1, 1, 1, -1, 1, -1, 1, 1, 1, 1, },
{ -1, 1, 1, -1, 1, 1, -1, 1, 1, -1, 1, 1, 1, -1, 1, },
{ 1, -1, -1, -1, 1, -1, 1, 1, -1, -1, 1, -1, 1, -1, -1, 1, },
{ -1, 1, -1, -1, -1, -1, -1, 1, 1, -1, 1, -1, 1, 1, 1, 1, },
{ -1, 1, -1, -1, -1, 1, 1, 1, -1, -1, -1, -1, -1, -1, -1, },
{ 1, 1, -1, -1, -1, 1, -1, -1, -1, -1, -1, 1, 1, 1, -1, },
{ -1, -1, -1, -1, -1, 1, 1, 1, 1, 1, -1, 1, 1, 1, 1, },
{ 1, -1, -1, -1, 1, -1, 1, 1, -1, 1, -1, 1, 1, -1, -1, },
{ -1, 1, 1, -1, 1, -1, 1, 1, -1, -1, -1, 1, -1, 1, -1, },
{ 1, 1, -1, -1, 1, -1, 1, 1, -1, 1, 1, -1, -1, -1, 1, },
{ -1, 1, 1, -1, -1, -1, 1, 1, -1, -1, -1, -1, -1, 1, -1, },
{ 1, -1, 1, -1, 1, 1, -1, 1, -1, 1, -1, -1, 1, 1, 1, },
{ -1, 1, 1, -1, -1, -1, -1, 1, 1, -1, -1, -1, -1, -1, -1, -1, },
{ 1, 1, 1, -1, -1, 1, -1, -1, -1, -1, -1, 1, 1, 1, -1, },
{ -1, -1, -1, -1, -1, 1, 1, 1, -1, -1, 1, 1, 1, 1, 1, },
{ -1, 1, 1, -1, -1, 1, 1, 1, -1, -1, -1, 1, -1, 1, -1, },
{ 1, 1, -1, -1, 1, -1, 1, 1, -1, 1, 1, -1, -1, -1, 1, },
{ 1, -1, 1, -1, 1, 1, -1, 1, -1, 1, -1, 1, -1, -1, -1, },
{ -1, 1, 1, -1, 1, 1, -1, 1, -1, 1, 1, -1, 1, 1, 1, },
{ 1, -1, 1, -1, 1, 1, -1, -1, 1, -1, -1, 1, 1, 1, 1, },
{ -1, 1, 1, -1, 1, 1, -1, -1, 1, 1, -1, -1, -1, -1, 1, },
{ 1, -1, 1, -1, 1, -1, -1, 1, -1, 1, 1, -1, -1, -1, 1, },
{ 1, -1, 1, -1, 1, -1, -1, -1, 1, 1, 1, -1, -1, -1, -1, },
{ -1, 1, 1, 1, -1, -1, -1, -1, -1, -1, -1, 1, -1, -1, -1, },
{ 1, -1, 1, 1, -1, 1, 1, 1, 1, 1, 1, 1, 1, 1, 1, 1, },
{ 1, -1, 1, 1, -1, 1, 1, 1, 1, -1, -1, -1, 1, -1, -1, },
{ -1, 1, 1, 1, -1, 1, 1, 1, -1, -1, 1, 1, -1, 1, 1, 1, },
{ 1, -1, 1, 1, 1, 1, 1, -1, -1, 1, 1, -1, -1, -1, },
{ -1, 1, 1, 1, 1, 1, -1, 1, 1, 1, -1, 1, -1, 1, 1, },
{ 1, -1, 1, 1, 1, 1, 1, -1, -1, -1, 1, 1, -1, -1, 1, },
{ 1, 1, -1, 1, -1, 1, -1, 1, 1, -1, -1, -1, -1, -1, 1, },
{ -1, -1, -1, 1, -1, 1, 1, -1, -1, 1, 1, -1, -1, -1, 1, },
{ -1, -1, -1, 1, -1, 1, -1, 1, -1, 1, -1, 1, -1, 1, -1, },
{ 1, 1, -1, 1, -1, 1, -1, -1, -1, 1, 1, 1, 1, -1, 1, },
{ 1, 1, -1, 1, 1, -1, 1, 1, -1, -1, 1, -1, -1, -1, -1, 1, },
{ -1, -1, 1, 1, -1, -1, 1, 1, -1, -1, -1, 1, -1, 1, 1, },
{ -1, -1, -1, 1, -1, 1, 1, 1, 1, 1, -1, -1, 1, 1, -1, },
{ 1, -1, 1, 1, 1, 1, 1, -1, -1, -1, -1, -1, -1, -1, -1, },
{ -1, -1, 1, 1, 1, 1, -1, 1, -1, 1, -1, -1, -1, 1, 1, },
{ 1, 1, -1, 1, 1, 1, 1, -1, -1, 1, 1, 1, -1, -1, 1, 1, },
{ -1, -1, 1, -1, -1, -1, -1, 1, 1, -1, -1, 1, 1, 1, -1, },
{ -1, -1, 1, 1, -1, -1, 1, -1, -1, 1, -1, 1, 1, 1, -1, },
{ 1, 1, 1, -1, -1, -1, 1, -1, 1, -1, 1, 1, -1, 1, -1, },
{ -1, -1, 1, -1, -1, -1, 1, 1, -1, 1, -1, 1, 1, 1, },
{ 1, 1, -1, 1, 1, 1, 1, 1, -1, -1, -1, -1, -1, -1, 1, },
{ 1, 1, 1, 1, 1, 1, 1, -1, -1, 1, -1, -1, 1, 1, -1, },
{ -1, -1, 1, 1, 1, 1, -1, -1, 1, 1, -1, 1, 1, -1, -1, -1, },
{ -1, -1, -1, 1, -1, 1, 1, -1, 1, -1, 1, -1, 1, 1, -1, },
{ 1, 1, -1, 1, 1, 1, -1, -1, 1, -1, 1, -1, -1, -1, -1, },
{ 1, 1, -1, 1, 1, 1, 1, 1, -1, 1, 1, -1, 1, -1, 1, -1, },
{ -1, -1, 1, 1, 1, 1, 1, 1, -1, 1, -1, 1, 1, 1, 1, },
{ -1, -1, 1, 1, 1, 1, -1, 1, -1, 1, 1, -1, -1, 1, },
{ 1, 1, 1, 1, 1, 1, -1, -1, 1, 1, -1, -1, 1, -1, -1, },
{ -1, 1, -1, 1, -1, 1, -1, 1, -1, -1, 1, 1, 1, 1, 1, },
{ -1, 1, -1, 1, -1, -1, 1, -1, -1, -1, -1, 1, -1, 1, -1, },
{ 1, -1, -1, 1, -1, 1, 1, -1, 1, 1, -1, -1, -1, -1, 1, 1, },
```

APPENDIX B

{ -1, 1, -1, 1, 1, -1, 1, -1, 1, 1, -1, -1, 1, 1, -1, -1, },
{ 1, -1, -1, 1, 1, -1, 1, -1, -1, -1, 1, 1, 1, 1, 1, 1, },
{ 1, -1, -1, 1, 1, -1, -1, 1, -1, -1, -1, -1, -1, -1, -1, -1, },
{ -1, 1, -1, 1, 1, -1, -1, 1, 1, 1, 1, 1, -1, -1, 1, 1, },
{ -1, -1, 1, 1, -1, -1, 1, -1, -1, -1, 1, 1, 1, 1, -1, -1, },
{ 1, 1, 1, 1, -1, -1, 1, -1, 1, -1, -1, 1, 1, 1, 1, 1, },
{ 1, 1, 1, 1, -1, -1, -1, 1, 1, -1, 1, 1, -1, -1, -1, -1, },
{ -1, -1, 1, 1, -1, -1, -1, 1, -1, 1, -1, -1, -1, -1, 1, 1, },
{ 1, 1, 1, 1, 1, 1, -1, 1, -1, 1, 1, 1, 1, 1, -1, -1, },
{ -1, 1, 1, 1, 1, 1, -1, 1, 1, -1, 1, 1, 1, 1, 1, 1, },
{ -1, -1, 1, 1, 1, 1, 1, -1, 1, -1, -1, -1, -1, -1, -1, -1, },
{ 1, 1, 1, 1, 1, 1, -1, -1, 1, 1, 1, -1, -1, 1, 1, },
{ 1, -1, -1, 1, -1, 1, 1, 1, -1, -1, 1, -1, 1, 1, 1, },
{ -1, 1, -1, 1, -1, 1, 1, 1, 1, 1, 1, -1, -1, 1, -1, },
{ -1, 1, -1, 1, -1, -1, -1, 1, 1, -1, 1, 1, -1, -1, 1, },
{ 1, -1, -1, 1, -1, 1, -1, -1, -1, 1, 1, -1, 1, 1, -1, },
{ -1, -1, 1, 1, -1, -1, -1, -1, 1, 1, -1, -1, 1, -1, 1, },
{ 1, -1, -1, 1, -1, -1, -1, -1, 1, 1, 1, 1, -1, 1, -1, },
{ 1, -1, 1, 1, -1, 1, 1, 1, 1, 1, -1, 1, -1, -1, 1, },
{ -1, 1, -1, 1, 1, -1, 1, 1, -1, -1, -1, 1, 1, -1, -1, 1, },
{ 1, -1, 1, 1, -1, 1, -1, 1, -1, -1, 1, 1, -1, -1, -1, 1, },
{ -1, 1, 1, 1, -1, -1, 1, -1, 1, 1, 1, -1, -1, -1, 1, },
{ -1, 1, 1, 1, -1, -1, 1, 1, 1, 1, -1, 1, 1, -1, 1, },
{ 1, -1, 1, 1, -1, -1, 1, -1, -1, 1, 1, 1, 1, -1, 1, },
{ -1, 1, 1, 1, 1, -1, 1, -1, -1, -1, 1, -1, -1, -1, 1, },
{ 1, -1, 1, 1, 1, -1, 1, 1, 1, 1, 1, -1, -1, -1, -1, },
{ 1, -1, 1, 1, 1, 1, -1, 1, 1, -1, 1, 1, 1, -1, 1, },
{ -1, 1, 1, 1, 1, 1, 1, -1, -1, -1, 1, -1, 1, 1, -1, },
{ -1, -1, -1, 1, -1, 1, 1, 1, -1, 1, -1, -1, 1, -1, -1, -1, },
{ 1, 1, -1, 1, -1, 1, 1, 1, 1, -1, 1, 1, 1, -1, 1, 1, },
{ 1, 1, -1, 1, -1, 1, -1, -1, 1, -1, -1, -1, -1, 1, -1, -1, },
{ -1, -1, -1, 1, -1, 1, -1, -1, -1, 1, 1, 1, -1, 1, 1, 1, },
{ 1, 1, -1, 1, 1, -1, -1, -1, 1, 1, 1, 1, -1, -1, -1, },
{ -1, -1, -1, 1, 1, -1, -1, 1, -1, -1, -1, 1, 1, 1, 1, 1, },
{ -1, -1, 1, 1, -1, 1, 1, 1, -1, 1, 1, -1, 1, -1, -1, },
{ 1, 1, -1, 1, 1, -1, 1, 1, -1, 1, -1, -1, 1, 1, 1, },
{ -1, -1, 1, 1, 1, -1, 1, 1, 1, -1, 1, 1, -1, -1, -1, },
{ 1, 1, 1, 1, -1, -1, 1, -1, -1, -1, 1, 1, 1, 1, 1, },
{ 1, 1, 1, 1, -1, 1, -1, -1, -1, -1, 1, -1, 1, -1, -1, },
{ -1, -1, 1, 1, 1, -1, 1, 1, 1, -1, -1, 1, 1, 1, 1, },
{ 1, 1, 1, -1, 1, 1, -1, 1, 1, 1, -1, 1, -1, -1, -1, },
{ -1, -1, 1, 1, -1, 1, 1, -1, 1, -1, -1, 1, 1, 1, 1, 1, },
{ -1, -1, 1, 1, -1, 1, 1, 1, 1, -1, 1, -1, -1, -1, -1, },
{ 1, 1, 1, 1, -1, 1, -1, 1, 1, 1, -1, 1, -1, 1, 1, 1, },
{ -1, 1, -1, 1, -1, -1, 1, 1, 1, -1, -1, -1, -1, -1, 1, },
{ 1, -1, -1, 1, -1, -1, 1, 1, -1, 1, 1, 1, -1, -1, 1, -1, },
{ 1, -1, -1, 1, -1, -1, 1, -1, -1, 1, -1, 1, 1, 1, -1, 1, },
{ -1, 1, -1, 1, -1, -1, -1, -1, 1, -1, 1, 1, 1, 1, -1, },
{ 1, -1, -1, 1, 1, 1, -1, -1, 1, -1, 1, 1, -1, -1, 1, 1, },
{ -1, 1, -1, 1, 1, 1, -1, -1, -1, 1, -1, -1, -1, 1, -1, },
{ -1, 1, -1, 1, 1, 1, 1, 1, -1, 1, 1, 1, 1, 1, -1, 1, },
{ 1, -1, -1, 1, 1, 1, 1, 1, 1, -1, -1, -1, 1, 1, 1, -1, },
{ 1, -1, 1, 1, 1, -1, -1, 1, 1, 1, 1, 1, 1, -1, 1, },
{ -1, 1, 1, 1, 1, -1, -1, 1, 1, -1, -1, -1, -1, 1, 1, -1, },
{ -1, 1, 1, 1, 1, 1, 1, 1, -1, -1, 1, 1, 1, 1, 1, },
{ 1, -1, 1, 1, -1, -1, 1, 1, -1, 1, -1, 1, 1, 1, -1, },
{ -1, 1, 1, 1, -1, 1, 1, -1, 1, -1, 1, 1, 1, -1, 1, },
{ 1, -1, 1, 1, -1, 1, -1, 1, -1, 1, 1, 1, 1, -1, 1, },
{ 1, -1, 1, 1, 1, -1, 1, 1, -1, 1, 1, -1, 1, 1, -1, 1, },
{ -1, 1, 1, 1, -1, 1, 1, -1, 1, 1, 1, -1, 1, -1, 1, },
{ 1, 1, -1, 1, -1, 1, 1, -1, 1, -1, 1, 1, 1, -1, 1, },
{ -1, -1, -1, 1, -1, -1, 1, 1, 1, 1, -1, 1, 1, 1, 1, 1, },
{ -1, -1, -1, 1, -1, -1, -1, 1, 1, 1, 1, -1, -1, 1, -1, -1, },
{ 1, -1, -1, 1, -1, -1, -1, -1, -1, 1, 1, -1, 1, 1, 1, },
{ -1, -1, -1, 1, 1, -1, -1, -1, 1, 1, 1, 1, -1, -1, },
{ 1, 1, -1, 1, 1, -1, -1, 1, 1, 1, -1, 1, 1, 1, 1, },
{ 1, 1, -1, 1, 1, 1, 1, 1, -1, 1, -1, -1, -1, -1, },
{ -1, -1, -1, 1, 1, 1, 1, -1, 1, -1, -1, -1, 1, 1, },
{ 1, -1, 1, 1, -1, -1, 1, -1, 1, -1, 1, 1, -1, 1, -1, },
{ -1, 1, 1, 1, 1, -1, -1, 1, 1, -1, -1, -1, -1, 1, 1, },
{ -1, 1, 1, 1, 1, -1, 1, -1, 1, 1, -1, 1, -1, 1, 1, },
{ -1, 1, 1, 1, -1, 1, 1, -1, -1, 1, 1, -1, -1, 1, },
{ 1, 1, 1, 1, -1, 1, 1, -1, -1, 1, -1, 1, 1, 1, -1, },
{ 1, 1, 1, -1, 1, 1, -1, 1, -1, 1, 1, -1, 1, -1, },
{ -1, 1, 1, 1, -1, 1, -1, 1, -1, -1, -1, 1, -1, 1, },
{ 1, -1, 1, -1, -1, 1, 1, -1, -1, 1, 1, -1, 1, -1, },
{ -1, -1, -1, 1, -1, -1, 1, 1, 1, 1, -1, 1, 1, 1, 1, },
{ -1, -1, -1, 1, -1, -1, -1, 1, 1, 1, 1, -1, -1, -1, -1, -1, },
{ 1, -1, -1, 1, -1, -1, -1, -1, -1, 1, 1, -1, 1, -1, 1, },
{ -1, -1, 1, 1, 1, -1, -1, -1, -1, 1, 1, 1, -1, -1, },
{ 1, -1, 1, 1, 1, -1, -1, 1, 1, 1, -1, 1, 1, 1, 1, },
{ 1, -1, 1, 1, 1, 1, 1, 1, 1, -1, 1, -1, -1, -1, -1, },
{ -1, -1, -1, 1, 1, 1, 1, 1, -1, 1, -1, -1, -1, 1, 1, },
{ 1, -1, 1, 1, -1, -1, 1, -1, 1, -1, 1, 1, -1, 1, -1, },
{ -1, 1, 1, 1, -1, -1, -1, 1, -1, 1, 1, 1, -1, 1, },
{ -1, 1, 1, 1, 1, -1, -1, 1, 1, 1, -1, 1, 1, 1, },
{ 1, -1, 1, -1, 1, -1, -1, -1, 1, -1, -1, -1, -1, -1, },
{ -1, 1, 1, 1, -1, 1, -1, 1, 1, -1, -1, -1, 1, 1, 1, },
{ 1, 1, -1, 1, -1, -1, 1, -1, 1, 1, 1, 1, -1, 1, },

APPENDIX B

{ -1, -1, -1, 1, -1, -1, 1, -1, -1, -1, -1, -1, 1, 1, -1, },
{ -1, -1, -1, 1, -1, -1, -1, 1, -1, -1, 1, 1, 1, -1, -1, 1, },
{ 1, 1, -1, 1, -1, -1, -1, 1, 1, 1, -1, -1, 1, -1, 1, -1, },
{ -1, -1, -1, 1, 1, 1, -1, 1, 1, 1, -1, -1, -1, 1, -1, 1, },
{ 1, 1, 1, 1, 1, 1, -1, 1, -1, -1, 1, 1, -1, 1, -1, },
{ 1, 1, -1, 1, 1, 1, -1, -1, -1, -1, -1, 1, -1, -1, 1, },
{ -1, -1, -1, 1, 1, 1, 1, -1, 1, 1, 1, 1, 1, -1, 1, -1, },
{ 1, 1, 1, 1, 1, -1, -1, -1, 1, 1, -1, -1, -1, -1, -1, 1, },
{ -1, -1, 1, 1, -1, 1, 1, -1, -1, 1, -1, 1, -1, -1, 1, -1, },
{ -1, -1, 1, 1, -1, 1, 1, -1, -1, -1, -1, 1, 1, -1, 1, 1, },
{ 1, 1, 1, 1, 1, -1, 1, 1, 1, 1, 1, 1, 1, 1, -1, },
{ -1, -1, 1, 1, -1, 1, 1, 1, 1, 1, 1, -1, -1, -1, 1, },
{ 1, 1, 1, 1, -1, 1, 1, -1, -1, -1, -1, 1, -1, -1, -1, -1, },
{ 1, 1, 1, -1, 1, -1, -1, -1, -1, 1, 1, 1, 1, -1, 1, },
{ -1, -1, 1, 1, -1, 1, -1, -1, 1, 1, -1, 1, 1, 1, -1, },
{ 1, -1, -1, 1, -1, -1, 1, -1, 1, -1, 1, 1, -1, -1, -1, },
{ -1, 1, -1, 1, -1, 1, -1, 1, 1, -1, 1, 1, -1, 1, 1, },
{ -1, 1, -1, 1, 1, -1, 1, 1, -1, 1, 1, -1, 1, 1, -1, },
{ 1, -1, -1, 1, -1, -1, 1, 1, -1, 1, 1, 1, 1, 1, },
{ -1, 1, -1, 1, 1, 1, -1, 1, -1, 1, 1, -1, -1, -1, -1, },
{ 1, -1, -1, 1, 1, 1, -1, 1, -1, 1, 1, -1, 1, 1, 1, },
{ 1, -1, -1, 1, 1, 1, 1, -1, 1, 1, -1, -1, 1, -1, -1, },
{ -1, 1, -1, 1, 1, 1, 1, -1, 1, -1, -1, 1, -1, 1, 1, 1, }

APPENDIX C

-1 1 1 1 1 1 1 -1 -1 1 1 -1 1 1 1 1 1 1
-1 1 1 -1 -1 1 1 -1 1 1 1 -1 -1 1 1 1 1 1 1 1
-1 1 1 -1 1 1 1 -1 -1 1 1 -1 1 1 -1 -1 1 1 -1 1 1 1
-1 1 1 1 1 1 1 -1 1 -1 -1 1 1 1 1 -1 1 1 -1
-1 1 1 1 -1 1 1 1 -1 1 1 -1 1 1 -1 -1 1 -1 -1 1 1 1
-1 1 1 -1 1 1 1 -1 -1 1 -1 -1 -1 -1 1 1 -1 -1 -1 1 1 1
-1 1 1 -1 -1 1 1 -1 -1 1 1 -1 -1 1 1 -1 1 1 1 1
-1 1 1 1 -1 1 1 1 1 -1 -1 -1 1 1 -1 -1 1 1 1 -1

Certain modifications of the present invention have been discussed above. Other modifications will occur to those practicing in the art of the present invention. For example, the blocks that have been described above in relation to the various drawing figures described herein may be hardware blocks, software modules, logic arrays, etc. Moreover, the arrangements shown in these drawing figures may be implemented as separate blocks as shown, or the blocks may be combined or divided as desired without departing from the scope of the invention.

Moreover, as disclosed above, the convolutional interleaver 14 and de-interleaver 40 are preferably characterized by the parameters N=48, B=16 and M=3. However, the convolutional interleaver 14 and de-interleaver 40 may be characterized by the other values for the parameters N, B, and M.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

We claim:

1. A method of generating a code vector comprising:
   providing N input data elements; and,
   generating a code vector comprising 2N data elements in response to the N input data elements, the first N data elements of the code vector representing a replica of the N input data elements, and the second N data elements of the code vector comprising N parity data elements, the combination of the first N data elements and the second N data elements forming a Kerdock code vector.

2. The method of claim 1 wherein the generating of a code vector comprises:
reading the second N data elements from a look-up table based upon an address comprising the first data elements; and,
appending the second N data elements to the N input data elements to form the Kerdock code vector.

3. The method of claim 2 wherein the look-up table comprises a $2^N/N$ look-up table.

4. The method of claim 3 wherein the $2^N/N$ look-up table comprises $2^N$ sets of N data elements substantially as set out in Appendix A.

5. The method of claim 1 wherein the generating of a code vector comprises reading all 2N data elements of the Kerdock code vector from a look-up table based upon an address comprising the N input data elements.

6. The method of claim 5 wherein the look-up table comprises a $2^N/2N$ look-up table.

7. The method of claim 6 wherein the $2^N/2N$ look-up table comprises $2^N$ Kerdock code vectors substantially as set out in Appendix B.

8. The method of claim 1 wherein the N input data elements comprise at least a portion of a map data unit, and wherein the map data unit indicates a distribution of first and second data segments in a field.

9. The method of claim 8 wherein 2N data elements of the Kerdock code vector are interleaved through m fields, and wherein N and m are both greater than one.

10. The method of claim 1 further comprising interleaving the 2N data elements throughout m fields, and wherein N and m are both greater than one.

11. A method of decoding a received Kerdock code vector in order to produce an output data signal, wherein the received Kerdock code vector comprises 2N data elements, the method comprising:
selecting one of a possible $2^N$ Kerdock code vectors as a best estimate of the received Kerdock code vector, wherein the selected Kerdock vector comprises 2N data elements; and,
using only the first N data elements of the selected Kerdock code vector as the output data signal.

12. The method of claim 11 wherein the selecting of one of a possible $2^N$ Kerdock code vectors comprises accessing the data elements substantially as set out in Appendix A.

13. The method of claim 12 wherein the $2^N$ Kerdock code vectors comprises $2^N$ Kerdock code vectors substantially as set out in Appendix B.

14. The method of claim 11 wherein the selecting of one of a possible $2^N$ Kerdock code vectors as a best estimate of the received Kerdock code vector comprises:
correlating each of the possible $2^N$ Kerdock code vectors with the received Kerdock code vector to derive corresponding correlations; and,
selecting the one of the possible $2^N$ Kerdock code vectors that corresponds to the greatest correlation as the best estimate of the received Kerdock code vector.

15. The method of claim 14 wherein the possible $2_N$ Kerdock code vectors are stored in a $2^N/2N$ look-up table.

16. The method of claim 15 wherein the $2_N$ Kerdock code vectors comprises $2_N$ Kerdock code vectors substantially as set out in Appendix B.

17. The method of claim 11 wherein the selecting of one of a possible $2^N$ Kerdock code vectors as a best estimate of the received Kerdock code vector comprises:

generating 0 to $(2^N-1)$ first N element sequences;
appending a corresponding second N element sequence to each of the 0 to $(2^N-1)$ first N element sequences so as to form a corresponding generated 2N element Kerdock code vector;
correlating each of the generated 2N element Kerdock code vectors with the received Kerdock code vector to derive corresponding correlations; and,
selecting the one of the generated 2N element Kerdock code vectors corresponding to the greatest correlation as the best estimate of the received Kerdock code vector.

18. The method of claim 17 wherein the second N element sequences are stored in a $2^N/N$ look-up table and are addressed in accordance with the first N element sequences.

19. The method of claim 18 wherein the $2^N$ second N element sequences comprises the $2^N$ sequences substantially as set out in Appendix A.

20. The method of claim 11 wherein the selecting of one of a possible $2^N$ Kerdock code vectors as a best estimate of the received Kerdock code vector comprises:
re-arranging the data elements of the received Kerdock code vector to produce a re-arranged Kerdock code vector;
multiplying the re-arranged Kerdock code vector by a plurality of coset leaders to produce a coefficient spectrum corresponding to each coset leader; and,
decoding a coefficient corresponding to a largest coefficient value in the coefficient spectra to produce the selected Kerdock code vector having 2N data elements.

21. The method of claim 20 wherein the multiplying of the re-arranged Kerdock code vector by a plurality of coset leaders comprises:
multiplying the re-arranged Kerdock code vector by the plurality of coset leaders to produce a vector multiplication result corresponding to each coset leader; and,
performing a transform on each vector multiplication result to produce a corresponding coefficient spectrum.

22. The method of claim 20 wherein the re-arranging of the data elements of the received Kerdock code vector comprises re-arranging the data elements of the received Kerdock code vector in accordance with the Table.

23. The method of claim 20 wherein the coset leaders comprise coset leaders substantially as set out in Appendix C.

24. The method of claim 11 wherein the selecting of one of a possible $2^N$ Kerdock code vectors as a best estimate of the received Kerdock code vector comprises:
re-arranging the data elements of the received Kerdock code vector according to a first re-arrangement scheme to produce a first re-arranged Kerdock code vector;
re-arranging the data elements of the received Kerdock code vector according to a second re-arrangement scheme to produce a second re-arranged Kerdock code vector, wherein the first and second re-arrangement schemes are different;
multiplying the first re-arranged Kerdock code vector by a first plurality of coset leaders to produce corresponding first coefficient spectra;
multiplying the second re-arranged Kerdock code vector by a second plurality of coset leaders to produce corresponding second coefficient spectra; and,
decoding a largest coefficient of the first and second coefficient spectra to produce the selected Kerdock code vector having 2N data elements.

25. The method of claim 24 wherein the multiplying of the first re-arranged Kerdock code vector by a first plurality of coset leaders comprises:

multiplying the first re-arranged Kerdock code vector by the first plurality of coset leaders to produce a first vector multiplication result corresponding to each of the first plurality of coset leaders; and, performing a first transform on each first vector multiplication result to produce a corresponding first coefficient spectrum;

wherein the multiplying of the second re-arranged Kerdock code vector by a second plurality of coset leaders comprises:

multiplying the second re-arranged Kerdock code vector by the second plurality of coset leaders to produce a second vector multiplication result corresponding to each of the second plurality of coset leaders; and, performing a second transform on each second vector multiplication result to produce a corresponding second coefficient spectrum.

26. The method of claim 24 wherein the re-arranging of the data elements of the received Kerdock code vector according to the first re-arrangement scheme comprises re-arranging the data elements of the received Kerdock code vector in accordance with the first column of the Table, and wherein the re-arranging of the data elements of the received Kerdock code vector according to the second re-arrangement scheme comprises re-arranging the data elements of the received Kerdock code vector in accordance with the second column of the Table.

27. The method of claim 24 wherein the first and second pluralities of coset leaders comprise coset leaders substantially as set out in Appendix C.

28. The method of claim 11 wherein the selecting of one of a possible $2^N$ Kerdock code vectors as a best estimate of the received Kerdock code vector comprises:

selecting one of the possible $2^N$ Kerdock code vectors as the best estimate of the received Kerdock code vector, and selecting another of the possible $2^N$ Kerdock code vectors as a second best estimate of the received Kerdock code vector; and, determining a reliability factor based upon a difference between the best estimate and the second best estimate.

29. The method of claim 28 wherein the output data signal comprises at least a portion of a map data unit, and wherein the map data unit indicates a distribution of first and second data segments in a received field.

30. The method of claim 29 wherein the map data unit is a first map data unit, wherein, if the reliability factor indicates that the output data signal is reliable, de-formatting the first and second data segments according to the first map data unit, and wherein, if the reliability factor indicates that the output data signal is unreliable, de-formatting the first and second data segments according to a second map data unit corresponding to a previously decoded field.

31. The method of claim 30 wherein the received Kerdock code vector is interleaved throughout a plurality of fields.

32. The method of claim 11 wherein the selecting of one of a possible $2^N$ Kerdock code vectors as a best estimate of the received Kerdock code vector comprises:

correlating each of the possible $2^N$ Kerdock code vectors with the received Kerdock code vector to derive corresponding correlations;

selecting the one of the possible $2^N$ Kerdock code vectors corresponding to the greatest correlation as the best estimate of the received Kerdock code vector, and selecting another of the possible $2^N$ Kerdock code vectors corresponding to a second greatest correlation as a second best estimate of the received Kerdock code vector; and, determining a reliability factor based upon a difference between the greatest correlation and the second greatest correlation.

33. The method of claim 11 wherein the output data signal comprises at least a portion of a map data unit, and wherein the map data unit indicates a distribution of first and second data segments in a received field.

34. The method of claim 33 wherein the received Kerdock code vector is interleaved throughout a plurality of fields.

35. The method of claim 11 wherein the received Kerdock code vector is a first received Kerdock code vector, wherein the method further comprises averaging the first received Kerdock code vector with a second received Kerdock code vector, and wherein the selecting of one of a possible $2^N$ Kerdock code vectors as a best estimate of the received Kerdock code vector comprises selecting one of a possible $2^N$ Kerdock code vectors as a best estimate of the average of the first and second received Kerdock code vectors.

36. The method of claim 11 further comprising de-interleaving the received Kerdock code vector, and wherein the selecting of one of a possible $2^N$ Kerdock code vectors as a best estimate of the received Kerdock code vector comprises selecting one of a possible $2^N$ Kerdock code vectors as a best estimate of the de-interleaved Kerdock code vector.

37. The method of claim 11 wherein the received Kerdock code vector is a first received Kerdock code vector, wherein the method further comprises de-interleaving the first received Kerdock code vector and averaging the de-interleaved first Kerdock code vector with a de-interleaved second received Kerdock code vector, and wherein the selecting of one of a possible $2^N$ Kerdock code vectors as a best estimate of the received Kerdock code vector comprises selecting one of a possible $2^N$ Kerdock code vectors as a best estimate of the average of the de-interleaved first and second received Kerdock code vectors.

38. The method of claim 11 wherein the selecting of one of a possible 2N Kerdock code vectors as a best estimate of the received Kerdock code vector comprises determining a reliability factor indicating reliability of the best estimate.

39. The method of claim 38 wherein the output data signal comprises at least a portion of a first map data unit, wherein the first map data unit indicates a distribution of first and second data segments in a received field, wherein, if the reliability factor indicates that the best estimate is reliable, de-formatting the first and second data segments according to the first map data unit, and wherein, if the reliability factor indicates that the best estimate is unreliable, de-formatting the first and second data segments according to a second map data unit corresponding to a previously decoded field.

40. A method of decoding a systematic code vector to produce a decoded data signal comprising:

receiving the systematic code vector;

re-arranging the data elements in the received systematic code vector to form a non-systematic code vector; and, decoding the non-systematic code vector using a non-systematic decoder to produce the decoded data signal.

41. The method of claim 40 wherein the re-arranging of the data elements comprises re-arranging the data elements in the received systematic code vector in accordance with the Table so as to form a non-systematic code vector.

42. The method of claim 40 wherein the decoding of the non-systematic code vector comprises:
  multiplying the non-systematic code vector by a plurality of reference code vectors to produce a coefficient spectrum corresponding to each reference code vector; and,
  decoding a coefficient corresponding to a largest coefficient value in the coefficient spectra to produce the decoded data signal.

43. The method of claim 42 wherein the reference code vectors comprise reference code vectors substantially as set out in Appendix C.

44. The method of claim 40 wherein the decoding of a coefficient comprises:
  decoding the coefficient to identify an intermediate code vector having 2N data elements; and,
  using the first N data elements of the intermediate code vector as the decoded data signal.

45. The method of claim 40 wherein the multiplying of the non-systematic code vector by a plurality of reference code vectors comprises:
  multiplying the non-systematic code vector by the plurality of reference code vectors to produce a vector multiplication result corresponding to each reference code vector; and,
  performing a transform on each vector multiplication result to produce a corresponding coefficient spectrum.

46. The method of claim 40 wherein the re-arranging of the data elements in the received systematic code vector to form a non-systematic code vector comprises:
  re-arranging the data elements of the received systematic code vector according to a first re-arrangement scheme to produce a first non-systematic code vector; and,
  re-arranging the data elements of the received systematic code vector according to a second re-arrangement scheme to produce a second non-systematic code vector, wherein the first and second re-arrangement schemes are different; and,
  wherein the decoding of the non-systematic code vector using a non-systematic decoder to produce the decoded data signal comprises:
    multiplying the first non-systematic code vector by a first plurality of reference code vectors to produce corresponding first coefficient spectra;
    multiplying the second non-systematic code vector by a second plurality of reference code vectors to produce corresponding second coefficient spectra; and,
    decoding a largest coefficient of the first and second coefficient spectra to produce the decoded data signal.

47. The method of claim 46 wherein the decoding of a largest coefficient comprises:
  decoding the largest coefficient of the first and second coefficient spectra to identify an intermediate code vector having 2N data elements; and,
  using the first N data elements of the intermediate code vector as the decoded data signal.

48. The method of claim 46 wherein the multiplying of the first non-systematic code vector by a first plurality of reference code vectors comprises:
  multiplying the first non-systematic code vector by the first plurality of reference code vectors to produce a first vector multiplication result corresponding to each of the first plurality of reference code vectors; and,
  performing a first transform on each first vector multiplication result to produce the corresponding first coefficient spectrum; and,
  wherein the multiplying of the second non-systematic code vector by a second plurality of reference code vectors comprises:
    multiplying the second non-systematic code vector by the second plurality of reference code vectors to produce a second vector multiplication result corresponding to each of the second plurality of reference code vectors; and,
    performing a second transform on each second vector multiplication result to produce the corresponding second coefficient spectrum.

49. The method of claim 46 wherein the re-arranging of the data elements of the received systematic code vector according to the first re-arrangement scheme comprises re-arranging the data elements of the received systematic code vector in accordance with the first column of the Table, and wherein the re-arranging of the data elements of the received systematic code vector according to the second re-arrangement scheme comprises re-arranging the data elements of the received systematic code vector in accordance with the second column of the Table.

50. The method of claim 46 wherein the first and second pluralities of reference code vectors comprise reference code vectors substantially as set out in Appendix C.

51. The method of claim 40 wherein the received systematic code vector comprises a received systematic Kerdock code vector, wherein the re-arranging of the data elements in the received systematic code vector to form a non-systematic code vector comprises re-arranging the data elements in the received systematic Kerdock code vector to form a non-systematic Kerdock code vector, and wherein the decoding of the non-systematic code vector comprises:
  multiplying the non-systematic Kerdock code vector by a plurality of coset leaders to produce a coefficient spectrum corresponding to each coset leader; and,
  decoding a coefficient corresponding to a largest coefficient value in the coefficient spectra to produce the decoded data signal.

52. The method of claim 51 wherein the decoding of a coefficient comprises:
  decoding the coefficient to identify an intermediate code vector having 2N data elements; and,
  using the first N data elements of the intermediate code vector as the decoded data signal.

53. The method of claim 51 wherein the multiplying of the non-systematic Kerdock code vector by a plurality of coset leaders comprises:
  multiplying the non-systematic Kerdock code vector by the plurality of coset leaders to produce a vector multiplication result corresponding to each coset leader; and,
  performing a transform on each vector multiplication result to produce the corresponding coefficient spectra.

54. The method of claim 40 wherein the received systematic code vector comprises a received systematic Kerdock code vector, wherein the re-arranging of the data elements in the received systematic code vector to form a non-systematic code vector comprises:
  re-arranging the received systematic Kerdock code vector according to a first re-arrangement scheme to produce a first non-systematic Kerdock code vector; and,
  re-arranging the received systematic Kerdock code vector according to a second re-arrangement scheme to produce a second non-systematic Kerdock code vector, wherein the first and second re-arrangement schemes are different; and, wherein the decoding of the non-systematic code vector comprises:

multiplying the first non-systematic Kerdock code vector by a first plurality of coset leaders to produce corresponding first coefficient spectra;

multiplying the second non-systematic Kerdock code vector by a second plurality of coset leaders to produce corresponding second coefficient spectra; and, decoding a largest coefficient of the first and second coefficient spectra to produce the decoded data signal.

55. The method of claim 54 wherein the decoding of a largest coefficient comprises:

decoding the largest coefficient of the first and second coefficient spectra to identify an intermediate code vector having 2N data elements; and, using the first N data elements of the intermediate code vector as the decoded data signal.

56. The method of claim 54 wherein the multiplying of the first non-systematic Kerdock code vector by a first plurality of coset leaders comprises:

multiplying the first non-systematic Kerdock code vector by the first plurality of coset leaders to produce a first vector multiplication result corresponding to each of the first plurality of coset leaders; and, performing a first transform on each first vector multiplication result to produce the corresponding first coefficient spectra; and, wherein the multiplying of the second non-systematic Kerdock code vector by a second plurality of coset leaders comprises:

multiplying the second non-systematic Kerdock code vector by the second plurality of coset leaders to produce a second vector multiplication result corresponding to each of the second plurality of coset leaders; and, performing a second transform on each second vector multiplication result to produce the corresponding second coefficient spectra.

57. A method of decoding a code vector comprising:

receiving a 2N element systematic Kerdock code vector, wherein the 2N element systematic Kerdock code vector includes at least a portion of a map data unit representing a distribution of first and second data segments in a received field;

decoding the 2N element systematic Kerdock code vector by selecting one of a possible $2^N$ Kerdock code vectors as a best estimate of the 2N element systematic Kerdock code vector, wherein the selected Kerdock code vector comprises 2N elements; and, using the first N elements of the selected Kerdock code vector as the portion of the map data unit.

58. The method of claim 57 wherein the selecting of one of a possible $2^N$ Kerdock code vectors comprises accessing the data elements substantially as set out in Appendix A.

59. The method of claim 57 wherein the $2^N$ Kerdock code vectors comprises $2^N$ Kerdock code vectors substantially as set out in Appendix B.

60. The method of claim 57 wherein the decoding of the 2N element systematic Kerdock code vector comprises:

multiplying 2N elements corresponding to the 2N element systematic Kerdock code vector by a plurality of reference code vectors to produce a coefficient spectrum corresponding to each reference code vector; and, decoding a coefficient corresponding to a largest coefficient value in the coefficient spectra to produce the selected Kerdock code vector.

61. The method of claim 60 wherein the multiplying of the 2N elements corresponding to the 2N element systematic Kerdock code vector by a plurality of reference code vectors comprises:

multiplying the 2N elements corresponding to the 2N element systematic Kerdock code vector by the plurality of reference code vectors to produce a vector multiplication result corresponding to each reference code vector; and, performing a transform on each vector multiplication result to produce a corresponding coefficient spectrum.

62. The method of claim 61 wherein the reference code vectors comprise reference code vectors substantially as set out in Appendix C.

63. The method of claim 60 wherein the reference code vectors comprise reference code vectors substantially as set out in Appendix C.

64. The method of claim 57 wherein the decoding of the 2N element systematic Kerdock code vector comprises:

re-arranging the elements of the 2N element systematic Kerdock code vector to produce a 2N element non-systematic Kerdock code vector;

multiplying the 2N element non-systematic Kerdock code vector by a plurality of reference code vectors to produce corresponding coefficient spectra;

decoding a largest coefficient of the coefficient spectra to produce the selected Kerdock code vector.

65. The method of claim 64 wherein the re-arranging of the elements comprises re-arranging the elements of the 2N element systematic code vector in accordance with the Table.

66. The method of claim 64 wherein the reference code vectors comprise reference code vectors substantially as set out in Appendix C.

67. The method of claim 64 wherein the multiplying of the 2N element non-systematic Kerdock code vector by a plurality of reference code vectors to produce coefficient spectra comprises:

multiplying the 2N element non-systematic Kerdock code vector by the plurality of reference code vectors to produce a vector multiplication result corresponding to each reference code vector; and, performing a transform on each vector multiplication result to produce a corresponding coefficient spectrum.

68. The method of claim 57 wherein the decoding of the 2N element systematic Kerdock code vector comprises:

re-arranging the elements of the 2N element systematic Kerdock code vector according to a first re-arrangement scheme to produce a first non-systematic Kerdock code vector;

re-arranging the elements of the 2N element systematic code vector according to a second re-arrangement scheme to produce a second non-systematic Kerdock code vector, wherein the first and second re-arrangement schemes are different;

multiplying the first non-systematic Kerdock code vector by a first plurality of reference code vectors to produce corresponding first coefficient spectra;

multiplying the second non-systematic Kerdock code vector by a second plurality of reference code vectors to produce corresponding second coefficient spectra; and, decoding a largest coefficient of the first and second coefficient spectra to produce the selected Kerdock code vector.

69. The method of claim 68 wherein the re-arranging of the 2N element systematic Kerdock code vector according to the first re-arrangement scheme comprises re-arranging the elements in accordance with the first column of the Table, and wherein the re-arranging of the elements of the 2N element systematic Kerdock code vector according to the second re-arrangement scheme comprises re-arranging the elements in accordance with the second column of the Table.

70. The method of claim 68 wherein the first and second pluralities of reference code vectors comprise reference code vectors substantially as set out in Appendix C.

71. The method of claim 68 wherein the multiplying of the first non-systematic Kerdock code vector by a first plurality of reference code vectors comprises:

multiplying the first non-systematic Kerdock code vector by the first plurality of reference code vectors to produce a first vector multiplication result corresponding to each of the first plurality of reference code vectors; and, performing a first transform on each first vector multiplication result to produce the corresponding first coefficient spectra; and, wherein the multiplying of the second non-systematic Kerdock code vector by a second plurality of reference code vectors comprises:

multiplying the second non-systematic Kerdock code vector by the second plurality of reference code vectors to produce a second vector multiplication result corresponding to each of the second plurality of reference code vectors; and, performing a second transform on each second vector multiplication result to produce the corresponding second coefficient spectra.

72. The method of claim 57 wherein N=8.

73. The method of claim 57 further comprising combining two or more map data unit portions to form a map data unit and de-formatting the first and second segments according to the map data unit.

74. The method of claim 57 wherein the decoding of the 2N element systematic Kerdock code vector comprises:

selecting one of the possible $2^N$ Kerdock code vectors as the best estimate of the 2N element systematic Kerdock code vector, and selecting another of the possible $2^N$ Kerdock code vectors as a second best estimate of the 2N element systematic Kerdock code vector; and, determining a reliability factor based upon a difference between the best estimate and the second best estimate.

75. The method of claim 74 further comprising combining two or more map data unit portions to form a map data unit, wherein the map data unit is a first map data unit, wherein, if the reliability factor indicates that the selected Kerdock code vector is reliable, de-formatting the first and second data segments according to the first map data unit, and wherein, if the reliability factor indicates that the selected Kerdock code vector is unreliable, de-formatting the first and second data segments according to a second map data unit corresponding to a previously decoded field.

76. The method of claim 57 wherein the selecting of one of a possible $2^N$ Kerdock code vectors comprises:

generating 0 to $(2^N-1)$ first N element sequences;

appending a corresponding second N element sequence to each of the 0 to $(2^N-1)$ first N element sequences so as to form a corresponding generated 2N element Kerdock code vector;

correlating each of the generated 2N element Kerdock code vectors with the received Kerdock code vector to derive corresponding correlations; and, selecting the one of the generated 2N element Kerdock code vectors corresponding to the greatest correlation as the best estimate of the 2N element systematic Kerdock code vector.

77. The method of claim 76 wherein the second N element sequences are stored in a $2^N/N$ look-up table and are addressed in accordance with the first N element sequences.

78. The method of claim 77 wherein the $2^N$ second N element sequences comprises the $2^N$ sequences substantially as set out in Appendix A.

* * * * *